United States Patent
Yamaji

(10) Patent No.: US 9,443,966 B2
(45) Date of Patent: Sep. 13, 2016

(54) HIGH BREAKDOWN VOLTAGE SEMICONDUCTOR DEVICE

(71) Applicant: FUJI ELECTRIC CO., LTD., Kawasaki-shi (JP)

(72) Inventor: Masaharu Yamaji, Matsumoto (JP)

(73) Assignee: FUJI ELECTRIC CO., LTD., Kawasaki-shi (JP)

( * ) Notice: Subject to any disclaimer, the term of this patent is extended or adjusted under 35 U.S.C. 154(b) by 0 days.

(21) Appl. No.: 14/249,219

(22) Filed: Apr. 9, 2014

(65) Prior Publication Data
US 2014/0217466 A1  Aug. 7, 2014

Related U.S. Application Data

(63) Continuation of application No. PCT/JP2012/076552, filed on Oct. 12, 2012.

(30) Foreign Application Priority Data

Nov. 11, 2011  (JP) ................. 2011-248015

(51) Int. Cl.
*H01L 29/66* (2006.01)
*H01L 29/739* (2006.01)
(Continued)

(52) U.S. Cl.
CPC ......... *H01L 29/7393* (2013.01); *H01L 21/765* (2013.01); *H01L 29/0696* (2013.01);
(Continued)

(58) Field of Classification Search
CPC ........... H01L 29/0696; H01L 29/7393; H01L 21/765; H01L 29/8611; H01L 29/7816; H01L 29/7835; H01L 29/405; H01L 29/7395; H01L 27/0922; H01L 29/42368; H01L 29/0634
USPC ........................................ 257/140
See application file for complete search history.

(56) References Cited

U.S. PATENT DOCUMENTS 6,323,539 B1 * 11/2001 Fujihira ............... H01L 27/088
257/354
6,603,185 B1 * 8/2003 Jimbo ................ H01L 27/0611
257/488

(Continued)

FOREIGN PATENT DOCUMENTS

EP  0738011 A2  10/1996
JP  3117023 B2  11/1992

(Continued)

OTHER PUBLICATIONS

International Search Report issued in PCT/JP2012/076552, dated Jan. 8, 2013. English translation provided.

(Continued)

*Primary Examiner* — Phat X Cao
*Assistant Examiner* — Mohammad M Hoque
(74) *Attorney, Agent, or Firm* — Rossi, Kimms & McDowell LLP

(57) ABSTRACT

An n-type region encloses an n-type well region is disclosed in which is disposed a high-side drive circuit. A high resistance polysilicon thin film configuring a resistive field plate structure of a high breakdown voltage junction termination region is disposed in spiral form on the n-type region. An OUT electrode, a ground electrode, and a Vcc1 electrode are disposed on the n-type region. The Vcc1 electrode is connected to the positive electrode of an auxiliary direct current power supply (a bootstrap capacitor). The OUT electrode is connected to the negative electrode of the auxiliary direct current power supply. One end portion (a second contact portion) of the high resistance polysilicon thin film is connected to the ground electrode, and the other end portion (a first contact portion) of the high resistance polysilicon thin film is connected to the OUT electrode.

15 Claims, 18 Drawing Sheets

(51) Int. Cl.
*H01L 29/06* (2006.01)
*H01L 29/40* (2006.01)
*H01L 29/78* (2006.01)
*H01L 29/861* (2006.01)
*H01L 21/765* (2006.01)
*H01L 29/423* (2006.01)
*H01L 27/092* (2006.01)

(52) U.S. Cl.
CPC ......... *H01L29/405* (2013.01); *H01L 29/7395* (2013.01); *H01L 29/7816* (2013.01); *H01L 29/7835* (2013.01); *H01L 29/8611* (2013.01); H01L 27/0922 (2013.01); H01L 29/0634 (2013.01); H01L 29/42368 (2013.01)

(56) References Cited

U.S. PATENT DOCUMENTS

| | | | |
|---|---|---|---|
| 7,183,626 B2 | 2/2007 | Ranjan | |
| 2001/0048122 A1 | 12/2001 | Tada et al. | |
| 2002/0135019 A1 | 9/2002 | Noda | |
| 2004/0120090 A1 | 6/2004 | Galli et al. | |
| 2004/0251499 A1 | 12/2004 | Yamaguchi et al. | |
| 2008/0117653 A1* | 5/2008 | Saito | H01L 29/405 363/20 |
| 2008/0315343 A1 | 12/2008 | Kitagawa | |
| 2010/0148823 A1 | 6/2010 | Shimizu | |
| 2010/0314710 A1 | 12/2010 | Yamaji | |
| 2014/0217466 A1* | 8/2014 | Yamaji | H01L 29/7395 257/140 |

FOREIGN PATENT DOCUMENTS

| | | | |
|---|---|---|---|
| JP | 2001-044431 A | | 2/2001 |
| JP | 2001-352064 A | | 12/2001 |
| JP | 2002-353448 A | | 12/2002 |
| JP | 2003-008009 A | | 1/2003 |
| JP | 2003008009 | * | 1/2003 |
| JP | 2003-008009 | * | 10/2003 |
| JP | 3591301 B2 | | 9/2004 |
| JP | 2005-005443 A | | 1/2005 |
| JP | 2008-010777 A | | 1/2008 |
| JP | 2008-153636 A | | 7/2008 |
| JP | 2008-227474 A | | 9/2008 |
| JP | 2011-018892 A | | 1/2011 |

OTHER PUBLICATIONS

M. Yoshino et al., "A new 1200 V HVIC with a novel high voltage Pch-MOS", Proceedings of the 22nd International Symposium on Power Semiconductor Devices & ICs, 2010, pp. 93 to 96.

Extended European Search Report issued in EP12847671.0, mailed May 6, 2015.

Endo et al., "A 500V 1A 1-Chip Inverter IC with a New Electric Field Reduction Structure", Proceedings of the International Symposium on Power Semiconductor Devices (ISPSD), May 31-Jun. 2, 1994, pp. 379-383, vol. Symp. 6, XP000505841.

* cited by examiner

HIGH BREAKDOWN VOLTAGE SEMICONDUCTOR DEVICE

BACKGROUND OF THE INVENTION

A. Field of the Invention

The present invention relates to a semiconductor device.

B. Description of the Related Art

As well as motor-controlling inverters, power devices are widely utilized in a large number of fields, such as large capacity PDPs (plasma display panels), power supply applications for FDPs (flat panel displays) such as liquid crystal panels, and inverters for domestic electrical appliances such as air conditioners or lighting. IGBTs (insulated gate bipolar transistors) and power MOSFETS (insulated gate field effect transistors) are known as this kind of power device.

To date, the drive and control of a power device has been carried out using an electronic circuit configured by combining a semiconductor device such as a photocoupler and an electronic part such as a transformer. However, owing to recent advances in LSI (large scale integrated circuit) technology, power devices are being used in 100 V AC (alternating current) and 200 V AC general household power supplies, 400 V AC industrial power supplies, and the like. Because of this, power devices with high voltage ICs of 100 V to 1,200 V breakdown voltage classes are being put to practical use.

High voltage ICs, being configured in various forms, are categorized into, for example, gate driver ICs incorporating a high-side gate driver and low-side gate driver of a power device, ICs incorporating an overheat protection or overcurrent protection function, inverter ICs wherein a control circuit and power device are integrated on the same semiconductor substrate (single-chip), and the like. Further, high voltage ICs contribute greatly to a reduction in size and increase in efficiency of an overall inverter system owing to a reduction in the number of parts mounted on a mounting substrate.

FIG. 16 is a circuit diagram showing a high voltage IC incorporating a general level shift circuit. In the circuit shown in FIG. 16, IGBTs (output power devices) 17 and 18 configure, for example, one phase of a PWM (Pulse Width Modulation) inverter bridge circuit. The IGBTs 17 and 18 are connected in series between a main direct current power supply (positive electrode side) Vdc supplying a high voltage of, for example, 400 V DC (direct current) or 400 V AC and a common potential COM (ground potential in FIG. 16), which is the negative electrode side of the main direct current power supply Vdc.

An OUT terminal, being a connection point of the emitter of IGBT 17 in the upper arm of the bridge circuit and the collector of IGBT 18 in the lower arm of the bridge circuit, is an alternating current output terminal of alternating current power generated by a complementary turning on and off of IGBT 17 and IGBT 18. An auxiliary direct current power supply (also called a driver power supply) E1 is such that the positive electrode is connected to a positive electrode line Vcc1, while the negative electrode is connected to the OUT terminal. An auxiliary direct current power supply (also called a driver power supply) E2 is such that the positive electrode is connected to a positive electrode line Vcc2, while the negative electrode is connected to the common potential COM. The auxiliary direct current power supplies E1 and E2 are low voltage power supplies of, for example, 15 V. Diodes 41 and 42 are connected respectively between the drain of a turn-on signal side high breakdown voltage MOSFET 1 and the alternating current output terminal OUT and between the drain of a turn-off signal side high breakdown voltage MOSFET 2 and the alternating current output terminal OUT, in order to cause surge current to flow to the common potential COM. Reference signs 51 and 52 are parasitic output capacities of the high breakdown voltage MOSFETs 1 and 2 respectively.

Furthermore, a level shift circuit and driver circuit 16 that drive IGBT 17 in the upper arm of the bridge circuit so as to be turned on and off, a driver circuit 20 that drives IGBT 18 in the lower arm of the bridge circuit so as to be turned on and off, and a control circuit (a low potential side low breakdown voltage circuit) 61 that inputs turn-on and turn-off signals into each of the driver circuits 16 and 20, are disposed in the high voltage IC shown in FIG. 16. The level shift circuit is configured of the high breakdown voltage MOSFETs 1 and 2, load resistors 3 and 4, NOT circuits 8 and 9 and subsequent stage low-pass filter circuits (hereafter referred to as LPFs) 30 and 31, an RS flip-flop (hereafter referred to as an RS latch) 15, and the like.

The level shift circuit and driver circuit 16 operate with the auxiliary direct current power supply E1 as a power supply. The driver circuit 20 operates with the auxiliary direct current power supply E2 as a power supply. The control circuit 61 is connected via the positive electrode line Vcc2 to the positive electrode of the auxiliary direct current power supply E2, and operates with the auxiliary direct current power supply E2 as a power supply. A high-side drive circuit (the circuit portion enclosed by the broken line in FIG. 16) 300 operates with the potential of the OUT terminal, which alternately follows the potentials of the common potential COM and main direct current power supply Vdc in accordance with a turning on and off of the IGBTs 17 and 18, as a reference. A bootstrap capacitor, for example, is used as the auxiliary direct current power supply E1 of the high-side drive circuit 300.

Control circuit 61 is connected to the gate of each of the high breakdown voltage MOSFETs 1 and 2, and to driver circuit 20. Control circuit 61 generates a set pulse turn-on signal 25 to be input into the gate of high breakdown voltage MOSFET 1, and reset pulse turn-off signal 26 to be input into the gate of high breakdown voltage MOSFET 2. Further, control circuit 61 inputs turn-on and turn-off signals into driver circuit 16 via the level shift circuit.

High breakdown voltage MOSFET 1 is energized by set pulse turn-on signal 25 input from control circuit 61. High breakdown voltage MOSFET 1 is a high breakdown voltage n-type channel MOSFET, and causes IGBT 17 to be turned on using the voltage drop of load resistor 3 connected to the collector of high breakdown voltage MOSFET 1 as a signal. High breakdown voltage MOSFET 2 is energized by the reset pulse turn-off signal 26 input from control circuit 61. High breakdown voltage MOSFET 2 is a high breakdown voltage n-type channel MOSFET, and causes IGBT 17 to be turned off using the voltage drop of the load resistor 4 connected to the collector of high breakdown voltage MOSFET 2 as a signal.

High breakdown voltage MOSFET 1 and high breakdown voltage MOSFET 2, and load resistor 3 and load resistor 4, are configured so as to be mutually equivalent in order that circuit constants coincide. Constant voltage diodes 5 and 6 connected in parallel to the load resistors 3 and 4 respectively restrict an excessive voltage drop of the load resistors 3 and 4, thereby protecting the NOT circuits 8 and 9 and the like. The two high breakdown voltage MOSFETs 1 and 2 are circuit portions of the level shift circuit that input signals based on the potential of the common potential COM into the level shift circuit.

End portions of load resistors 3 and 4 on the side opposite to the end portions on the side connected to high breakdown voltage MOSFETs 1 and 2 are connected to the positive electrode line Vcc1 to which the positive electrode of the auxiliary direct current power supply E1 is connected. Because of this, as the potential of the OUT terminal varies between the potential of the common potential COM and the main direct current power supply Vdc potential, the power supply voltage of a load resistor circuit of high breakdown voltage MOSFETs 1 and 2 formed of load resistors 3 and 4 varies between a power supply voltage wherein the voltages of the auxiliary direct current power supply E1 and main direct current power supply Vdc are added together and the power supply voltage of the auxiliary direct current power supply E1.

A method whereby input signals input into IGBT 17 in the upper arm of the bridge circuit are controlled by the two high breakdown voltage MOSFETs 1 and 2 in this way is normally called a two-input method. When configuring the level shift circuit using the two-input method, the output of the OUT terminal becomes HIGH when set pulse turn-on signal 25 is input into high breakdown voltage MOSFET 1. Because of this, the potential of the OUT terminal rises from the potential of the common potential COM to the main direct current power supply Vdc potential.

Actually, however, the potential of the OUT terminal transiently jumps higher than the main direct current power supply Vdc potential due to an inductance element caused by a load such as a motor, or wiring or the like, connected to the OUT terminal. Because of this, in order to avoid destruction due to this switching noise, it is necessary to guarantee a breakdown voltage for a high voltage IC and power devices such as the high breakdown voltage MOSFETs 1 and 2 such that a voltage higher than the main power supply voltage on the high voltage side can be withstood. For example, commercially available high voltage ICs and power devices are such that a breakdown voltage of 600 V is guaranteed in the case of a 200 V AC system power supply, and a breakdown voltage of 1,200 V is guaranteed in the case of a 400 V AC system power supply.

FIG. 17 is a plan view showing a planar structure of a heretofore known high voltage IC. As shown in FIG. 17, a high voltage IC 1000 is formed in an n-type diffusion (or n-type epitaxial) region 1001 provided on a p-type substrate (not shown) having ground potential. In order to realize a high breakdown voltage of 600 V or 1,200 V, a high breakdown voltage junction termination structure (HVJT) region 1011 and a high breakdown voltage device such as a high breakdown voltage n-type channel MOSFET 1012 are incorporated in high voltage IC 1000. Depending on the protective function form, a high breakdown voltage device such as high breakdown voltage p-type channel MOSFET 1013 is also incorporated.

High breakdown voltage junction termination structure region 1011 encloses a high potential region in which high-side drive circuit 300 is provided. High breakdown voltage n-type channel MOSFET 1012 and high breakdown voltage p-type channel MOSFET 1013 are provided in high breakdown voltage junction termination structure region 1011. The high breakdown voltage n-type channel MOSFET 1012 is connected to control circuit 61 and high-side drive circuit 300, and configures, for example, a level shift circuit. High breakdown voltage p-type channel MOSFET 1013 is connected to control circuit 61. Each of high breakdown voltage junction termination structure region 1011, high breakdown voltage n-type channel MOSFET 1012, and high breakdown voltage p-type channel MOSFET 1013 realizes a desired breakdown voltage in a junction portion between the p-type substrate and n-type diffusion region 1001, to which a high voltage is applied.

Next, a description will be given of the reliability of a high voltage IC including a withstand region. A withstand region is a region in which high breakdown voltage junction termination structure region 1011, a high breakdown voltage device such as high breakdown voltage n-type channel MOSFET 1012, and an element separation region are provided. When the high breakdown voltage device configuring the withstand region is of, for example, a lateral device structure, the electric field on the withstand region surface between the anode and cathode, or between the source and drain (between a high voltage electrode and a low voltage electrode), of the high breakdown voltage device increases more the higher the voltage applied to the high voltage IC. Because of this, the breakdown voltage of the high voltage IC drops or fluctuates due to movable ions or a charge accumulation in the mold resin, because of which the reliability of the high voltage IC decreases.

A device in which is provided a capacitive field plate structure wherein polysilicon or metal is capacitively coupled to a field plate electrode provided across a dielectric on the withstand region surface has been proposed as a device that eliminates this kind of problem (for example, refer to JP-A-2002-353448 and Japanese Patent No. 3,591,301). Also, a device in which is provided a resistive field plate structure wherein an oxygen-doped semi-insulating polysilicon (SIPOS) thin film or a high resistance polysilicon thin film is disposed in a spiral form across a dielectric on the withstand region surface from another region (hereafter referred to as a low potential region) separated from a high potential region by a surface element separation region to the high potential region has been proposed as another device (for example, refer to Japanese Patent No. 3,117,023, U.S. Pat. No. 7,183,626 and JP-A-2003-8009).

However, when the breakdown voltage guaranteed in the withstand region is extremely high, such as in a high voltage IC of, for example, a 1,200 V breakdown voltage class, it is necessary that the impurity concentration of the withstand region be extremely low. However, due to the impurity concentration of the withstand region surface being low, and the voltage applied to the high voltage IC being high, the adverse effect on the breakdown voltage characteristics of the high voltage IC caused by movable ions or charge of the mold resin is even more noticeable.

In this case, the movable ions or charge of the mold resin accumulate on a protective film of the high voltage IC, because of which, with a capacitive field plate structure, it is not possible to maintain an even potential distribution in the withstand region with respect to the amount of movable ions or charge accumulated on the protective film on the withstand region. Because of this, when the breakdown voltage guaranteed in the withstand region is extremely high, or when the amount of charge contained in the mold resin is extremely large, it is often the case that the resistive field plate structure is applied such that deterioration in breakdown voltage characteristics due to movable ions or charge in the mold resin is unlikely to occur.

A resistive field plate structure is such that when, for example, a high voltage is applied between the high voltage electrode and low voltage electrode of the withstand region, a minute current flows in the resistive field plate structure, and a successive voltage drop occurs from the high potential region side to the low potential region side. Because of this, the potential distribution in the withstand region is forcibly kept even, and the electric field on the withstand region surface is alleviated, because of which stable breakdown voltage characteristics are obtained. A device wherein a resistive field plate structure is actually disposed in a spiral form on the withstand region of a high voltage IC of a 1,200 V breakdown voltage class has also been proposed (for example, refer to M. Yoshino et al., "A new 1200 V HVIC with a novel high voltage Pch-MOS", Proceedings of the 22$^{nd}$ International Symposium on Power Semiconductor Devices & ICs, 2010, pages 93 to 96.).

Next, a description will be given of a planar structure of a resistive field plate structure shown in Yoshino et al. (2010). FIG. 18 is a plan view showing a planar structure of a heretofore known resistive field plate structure. Also, FIG. 19 is a characteristic diagram showing breakdown voltage characteristics of a heretofore known high breakdown voltage device. FIGS. 18 and 19 are FIGS. 2 and 12 respectively of Yoshino et al. (2010). As shown in FIG. 18, high breakdown voltage junction termination structure region 1203 including a high breakdown voltage n-type channel MOSFET or high breakdown voltage p-type channel MOSFET (not shown) is provided between high potential region 1201 and low potential region 1202. High resistance polysilicon thin film 1204 configuring a resistive field plate structure is disposed in a spiral form on high breakdown voltage junction termination structure region 1203.

The leakage current when a high voltage of 1,200 V is applied to a high-side high voltage terminal (not shown) in the high breakdown voltage junction termination structure region 1203 is approximately 30 µA. Normally, a high breakdown voltage p-type channel MOSFET is used as a level-down device that transmits an error signal from a high-side drive circuit portion to a low-side control circuit in order to detect an overcurrent in the upper arm IGBT. Because of this, the source of the high breakdown voltage p-type channel MOSFET is connected to the positive electrode line Vcc1 to which is connected the positive electrode of the auxiliary direct current power supply E1, which is the power supply voltage of the high-side drive circuit portion.

Consequently, the occurrence of a resistive leak as shown in FIG. 19 indicates that one end portion of the high resistance polysilicon thin film 1204 configuring the resistive field plate structure is connected to the positive electrode line Vcc1. That is, the leakage current in Yoshino et al. (2010) is a leak element flowing through the high resistance polysilicon thin film connected between the positive electrode line Vcc1 and the ground.

A device wherein an alleviation of the withstand region surface electric field is attempted by providing a combination of a capacitive field plate structure and a resistive field plate structure has been proposed as a device that reduces the adverse effect of the leakage current on a high voltage IC, and reduces the adverse effect of movable ions or a charge on the high voltage IC (for example, refer to JP-A-2005-5443).

Generally, with a power device gate drive method using a high voltage IC (HVIC), a bootstrap circuit formed of a bootstrap diode (BSD) and bootstrap capacitor is connected to high-side drive circuit 300 shown in FIG. 16. In this case, the voltage of the bootstrap capacitor configuring the auxiliary direct current power supply E1 (hereafter referred to as the bootstrap capacitor E1) becomes the power supply voltage of high-side drive circuit 300, and also becomes the gate voltage of upper arm IGBT 17. The bootstrap capacitor E1 is a floating power supply whose power supply voltage varies in accordance with the potential of the OUT terminal.

A description will be given of a charge and discharge cycle of the bootstrap capacitor E1. As a basic operation of high-side drive circuit 300, when an output signal of a low-side drive circuit (low-side driver) formed of driver circuit 20 is at a high level, lower arm IGBT 18 changes to an on-state, and the potential of the OUT terminal is pulled down to the common potential COM. For this period, the bootstrap capacitor E1 is charged by the forward current of the BSD whose anode electrode is connected to the positive electrode line Vcc2 to which the positive electrode of the auxiliary direct current power supply E2 is connected. The voltage of the bootstrap capacitor E1 is charged to, for example, 14.4 V, which is the value obtained after the BSD forward voltage drop (VF) 0.6 V is subtracted from 15 V.

Meanwhile, when the output signal of the low-side drive circuit is at a low level, lower arm IGBT 18 changes to an off-state. In a subsequent dead time period, upper arm IGBT 17 changes to an on-state when an output signal of the high-side drive circuit (high-side driver) 300 is at a high level, and the potential of the OUT terminal rises to the voltage of the main direct current power supply Vdc (and transiently to a still higher voltage). For this period, the charge of the bootstrap capacitor E1 is released in order to charge the gate capacitor of upper arm IGBT 17. The amount of the bootstrap capacitor E1 voltage drop caused by the discharge may be approximately several volts, depending on upper arm IGBT 17 gate capacitance and gate-to-source leakage current, and on the amount of leakage current from the positive electrode line Vcc1 to the ground.

When the voltage of the bootstrap capacitor E1 drops, the drive capability of upper arm IGBT 17 decreases, and the output current of IGBT 17 decreases. Also, when the voltage of the bootstrap capacitor E1 drops beyond the stopping voltage of a UVLO (Under Voltage Lock Out, not shown) provided in high-side drive circuit 300, there is concern that the output of high-side drive circuit 300 will stop. For example, in the event that the voltage of the bootstrap capacitor E1 drops from 14.4 V to 10.4 V due to a discharge when the stopping voltage of the UVLO function is 11 V, the output of high-side drive circuit 300 will stop.

Normally, the UVLO is a high-side CMOS logic circuit provided between the RS latch 15 (R terminal) and positive electrode line Vcc1 in high-side drive circuit 300. Consequently, when designing high-side drive circuit 300, design is carried out so that the voltage of the bootstrap capacitor E1 is charged to a desired voltage (herein, 14.4 V), and the drive capability of upper arm IGBT 17 is always fulfilled to the maximum, taking into consideration parameters such as a gate capacitance Qg of the IGBTs 17 and 18, the capacitance of the bootstrap capacitor E1, the backflow prevention performance of the bootstrap diode, the amount of leakage current from the positive electrode line Vcc1 to the ground, and the on-state time of upper and lower arm IGBTs 17 and 18.

However, in the case of disposing a resistive field plate structure on the withstand region in order to achieve increased reliability when a breakdown voltage class of 1,200 V or the like is adopted, or when the amount of charge contained in the mold resin is large, the high resistance polysilicon thin film is connected to each of the positive electrode line Vcc1 and the ground in order to maintain breakdown voltage characteristics and for ease of layout, because of which the amount of leakage current from the positive electrode line Vcc1 to the ground increases.

For example, normally, when providing a capacitive field plate structure on the withstand region, the amount of leakage current from the positive electrode line Vcc1 to the ground is approximately several hundred nA to several µA, but when providing a resistive field plate structure on the withstand region, the amount of leakage current from the positive electrode line Vcc1 to the ground is larger than when providing a capacitive field plate structure. A specific calculation will be made of the amount of leakage current from the positive electrode line Vcc1 to the ground in the case of providing a resistive field plate structure on the withstand region.

For example, when taking the sheet resistance value of the high resistance polysilicon thin film to be 2 kΩ/sq, the peripheral length of the high breakdown voltage junction termination region to be 1 mm, the high resistance polysilicon thin film to be disposed in a spiral form to a width of 1 μm and at 1 μm intervals, and the width of the high breakdown voltage junction termination region from the high potential region to the element separation region (hereafter referred to as the width of the high breakdown voltage junction termination region) to be 150 μm, the high resistance polysilicon thin film is disposed to approximately 15 spirals on the high breakdown voltage junction termination region. The width of the high resistance polysilicon thin film is the width of the high resistance polysilicon thin film in a direction perpendicular to the direction in which the spirals of the high resistance polysilicon thin film extend. The interval of the high resistance polysilicon thin film is the interval between spiral lines adjacent in the width direction of the high resistance polysilicon thin film (hereafter referred to as the spiral interval). A total resistance value Rpoly of the high resistance polysilicon thin film at this time is calculated as in Equation (1) below.

$$R\text{poly}=2{,}000\times(1{,}000/1)\times15=30{,}000{,}000(\Omega) \quad (1)$$

Also, when supposing that the potential of the positive electrode line Vcc1 rises to 1,200 V, a leakage current Ileak from the positive electrode line Vcc1 to the ground is calculated as in Equation (2) below.

$$I\text{leak}=1{,}200/30{,}000{,}000=40\times10^{-6}(A) \quad (2)$$

As shown in Equations (1) and (2) above, the leakage current of a high voltage IC when providing a resistive field plate structure on the high breakdown voltage junction termination region is as much as 40 μA greater than when providing a capacitive field plate structure on the high breakdown voltage junction termination region. In this way, the leakage current of a high voltage IC when providing a resistive field plate structure on the high breakdown voltage junction termination region is as much as 10 times or more greater than when not providing a resistive field plate structure.

FIG. 15 is an illustration showing discharge paths of the bootstrap capacitor of the heretofore known high voltage IC. High voltage IC 1000 shown in FIG. 15 is such that the discharge paths of the bootstrap capacitor E1 are indicated in the high voltage IC circuit diagram shown in FIG. 16. As shown in FIG. 15, when upper arm IGBT 17 is turned on, the bootstrap capacitor E1 is discharged along the following first to third paths 71 to 73. The first path 71 (indicated by a dotted line arrow) is the path of a current flowing when applying a gate voltage to upper arm IGBT 17 via the positive electrode line Vcc1 and high-side drive circuit 300.

The second path 72 (indicated by a coarser arrow than that of reference sign 71) is the path of the reverse leakage current of a high breakdown voltage diode 1400 configuring the high breakdown voltage junction termination region connected between the positive electrode line Vcc1 of high voltage IC 1000 and the ground (the common potential COM). The paths of the reverse leakage current of a level shifter element (the constant voltage diodes 5 and 6 of FIG. 16) 1402 connected in parallel via a level shift resistor (the load resistors 3 and 4 of FIG. 16) to the high breakdown voltage diode 1400, and of the body diodes of the high breakdown voltage MOSFETs 1 and 2, are also included in the second path 72.

The third path 73 (indicated by a finer arrow than that of reference sign 71) is the path of the leakage current in resistive field plate structure portion 1401 connected in parallel to high breakdown voltage diode 1400. The second path 72 and third path 73 are paths in the high voltage IC along which the bootstrap capacitor E1 is discharged. The current discharged along the second path 72 is approximately several hundred nA to several μA, and can be ignored as it is sufficiently small with respect to the current of approximately 60 μA discharged along the third path 73.

Next, a description will be given of the amount by which the voltage of the bootstrap capacitor E1 drops due to the discharge along the third path 73 (hereafter referred to as a voltage drop amount). A voltage drop amount ΔVbs (V) of the bootstrap capacitor E1 due to the discharge is represented by Equation (3) below. In Equation (3), the capacitance of the bootstrap capacitor E1 is taken to be Cbs(F), the leakage current from the positive electrode line Vcc1 to the ground to be Ileak (A), and upper arm IGBT 17 to be in an on-state from t1(S) to t2(s).

Math. 1

$$\Delta Vbs=\{\int_{t1}^{t2}I\text{leak}\cdot dt\}/Cbs \quad (3)$$

In order to reduce the discharge drop amount ΔVbs of the bootstrap capacitor E1, it is conceivable judging from Equation (1) to increase the capacitance of the bootstrap capacitor E1 (for example, by using a large capacity electrolytic capacitor, or the like), or to reduce the period for which upper arm IGBT 17 is in an on-state (=t2−t1, hereafter referred to as the on-state period). However, a problem occurs in that the PCB (Printed Circuit Board) area of an inverter power supply system will be increased by increasing the capacity of an electrolytic capacitor (approximately several μF). Also, by reducing the on-state period of upper arm IGBT 17, the standard width between the minimum on-state time t1 and maximum on-state time t2 narrows, and a problem occurs in that the operation of the high voltage IC is restricted.

Also, in order to reduce the discharge drop amount ΔVbs of the bootstrap capacitor E1, it is conceivable judging from Equation (1) to further increase the total resistance value of resistive field plate structure portion 1401, thereby reducing the leakage current amount Ileak from the positive electrode line Vcc1 to the ground. In order to reduce the leakage current amount Ileak, it is necessary to reduce the width and spiral interval of a high resistance polysilicon thin film having a spiral planar form, thereby reducing the disposition area of the high resistance polysilicon thin film. However, when disposing the high resistance polysilicon thin film with the heretofore described dimensions (1 μm width and 1 μm interval) or lower, the following kinds of problem occur.

For example, when reducing the width of the high resistance polysilicon thin film, problems occur with processing accuracy in the manufacturing process in that it is difficult to optimize resist exposure conditions when patterning the high resistance polysilicon thin film, the high resistance polysilicon thin film becomes detached when etching the high resistance polysilicon thin film, and the like. Also, when reducing the spiral interval of the high resistance polysilicon thin film far too much, polymers, particles, and the like, adhere to the side surface or upper portion of the high resistance polysilicon thin film. Because of this, a short circuit may occur within the high resistance polysilicon thin film. Because of this, realistically, it is also difficult to reduce the disposition area of the high resistance polysilicon thin film.

Also, in order to reduce the leakage current amount Ileak, it is conceivable to increase the width of the withstand region of the high breakdown voltage junction termination region in resistive field plate structure portion 1401 to, for example, approximately 300 μm, thereby increasing the number of spirals of the high resistance polysilicon thin film, and increasing the total resistance value of resistive field plate structure portion 1401. However, it is necessary to optimize the high breakdown voltage device structure in order to increase the width of the withstand region of the high breakdown voltage junction termination region, and the chip area also increases, which is not desirable as the cost increases considerably.

Also, it is conceivable to increase the sheet resistance value of the high resistance polysilicon thin film itself in order to increase the total resistance value of resistive field plate structure portion 1401. For example, when forming a high resistance polysilicon thin film doped with an impurity to a low impurity concentration on resistive field plate structure portion 1401 so that the sheet resistance value is approximately 10 kΩ/sq, the high resistance polysilicon thin film provided on high-side drive circuit 300, low-side drive circuit, and control circuit 61 in the high voltage IC is also formed with a sheet resistance value of approximately 10 kΩ/sq, in the same way as the high resistance polysilicon thin film of resistive field plate structure portion 1401.

Because of this, when the sheet resistance value of the high resistance polysilicon thin film other than that on resistive field plate structure portion 1401 is approximately 10 kΩ/sq, fluctuation in the resistance division ratio and absolute resistance value increases, and the accuracy of the resistor element itself in the high voltage IC deteriorates. Because of this, it is necessary to form a high resistance polysilicon thin film exclusively for increasing the resistance of resistive field plate structure portion 1401, separate from the high resistance polysilicon thin film on high-side drive circuit 300, low-side drive circuit, and control circuit 61 in the high voltage IC. Consequently, it is necessary to add a photolithography step, an ion implantation step, and the like, exclusively for forming a low impurity concentration high resistance polysilicon thin film on resistive field plate structure portion 1401, and there is a problem in that the manufacturing cost increases.

SUMMARY OF THE INVENTION

The invention, in order to eliminate the heretofore described problems with the heretofore known technology, provides a semiconductor device such that it is possible to maintain the reliability of a high voltage IC. Also, the invention, in order to eliminate the heretofore described problems with the heretofore known technology, provides a high breakdown voltage semiconductor device. Also, the invention, in order to eliminate the heretofore described problems with the heretofore known technology, provides a semiconductor device such that it is possible to reduce cost.

In order to solve the heretofore described problems, a semiconductor device according to an aspect of the invention has the following characteristics. A second conductivity type well region, one surface of which is in contact with a first conductivity type semiconductor layer, is provided. A first conductivity type well region in contact with the second conductivity type well region and enclosing the second conductivity type well region is provided. A second conductivity type high concentration region having an impurity concentration higher than that of the second conductivity type well region is provided in the second conductivity type well region. A first conductivity type high concentration region having an impurity concentration higher than that of the first conductivity type well region is provided in the first conductivity type well region. A resistive thin film layer is provided across a dielectric on the other surface of the second conductivity type well region. A first electrode disposed so as to enclose the resistive thin film layer and connected to the first conductivity type high concentration region is provided. A second electrode, connected to the second conductivity type high concentration region, to which is applied a voltage higher than the voltage applied to the first electrode, is provided. A third electrode, disposed in an inner peripheral side of the first electrode than the resistive thin film layer, to which is applied a voltage higher than the voltage applied to the first electrode and lower than the voltage applied to the second electrode, is provided. One end portion of the resistive thin film layer is connected to the first electrode, while the other end portion of the resistive thin film layer is connected to the third electrode.

Also, in order to solve the heretofore described problems, a semiconductor device according to another aspect of the invention has the following characteristics. A second conductivity type well region one surface of which is in contact with a first conductivity type semiconductor layer is provided. A first conductivity type well region in contact with the second conductivity type well region and enclosing the second conductivity type well region is provided. A second conductivity type high concentration region having an impurity concentration higher than that of the second conductivity type well region is provided in the second conductivity type well region. A first conductivity type high concentration region having an impurity concentration higher than that of the first conductivity type well region is provided in the first conductivity type well region. A first conductivity type body region is provided more shallowly than the second conductivity type well region on the other surface side of the second conductivity type well region in the second conductivity type well region. A resistive thin film layer is provided across a dielectric covering the first conductivity type body region on the other surface of the second conductivity type well region. A first electrode disposed so as to enclose the resistive thin film layer and connected to the first conductivity type high concentration region is provided. A second electrode, connected to the second conductivity type high concentration region, to which is applied a voltage higher than the voltage applied to the first electrode is provided. A third electrode, disposed in an inner peripheral side of the first electrode than the resistive thin film layer, to which is applied a voltage higher than the voltage applied to the first electrode and lower than the voltage applied to the second electrode, is provided. One end portion of the resistive thin film layer is connected to the first electrode, while the other end portion of the resistive thin film layer is connected to the third electrode.

Also, the semiconductor device according to the first aspect of the invention is characterized in that the second electrode is connected to the positive electrode side of a bootstrap capacitor configuring a bootstrap circuit, and the third electrode is connected to the negative electrode side of the bootstrap capacitor.

Also, the semiconductor device according to the first aspect of the invention is characterized by including a diode structure configured with the second conductivity type well region as a cathode region and the first conductivity type well region as an anode region.

Also, the semiconductor device according to the first aspect of the invention is characterized by including a transistor structure configured with the second conductivity type well region as a drift region, the first conductivity type well region as a base region, and a second conductivity type region provided in the first conductivity type well region and connected to the first electrode as a source region.

Also, the semiconductor device according to the second aspect of the invention is characterized by including a transistor structure configured with the first conductivity type body region as a drift region, the second conductivity type well region as a base region, and a first conductivity type region provided in the second conductivity type well region and connected to the second electrode as a source region.

Also, the semiconductor device according to the first aspect of the invention is characterized in that the resistive thin film layer is disposed in a spiral form.

Also, the semiconductor device according to the first aspect of the invention is characterized in that the other end portion of the resistive thin film layer is led out in the dielectric between the second conductivity type well region and the second electrode, and connected to the third electrode.

Also, the semiconductor device according to the first aspect of the invention is characterized by further including a first conductivity type separation region enclosing one portion of the second conductivity type well region, wherein an insulated gate field effect transistor with the second conductivity type well region as a drift region is provided in a region of the second conductivity type well region enclosed by the first conductivity type separation region.

Also, the semiconductor device according to the first aspect of the invention is characterized in that the resistive thin film layer is made of polysilicon.

Also, the semiconductor device according to the first aspect of the invention is characterized in that the second conductivity type well region is a diffusion layer.

Also, the semiconductor device according to the first aspect of the invention is characterized in that the second conductivity type well region is an epitaxial layer.

According to the invention, it is possible, by connecting one end portion of the resistive thin film layer to the first electrode and the other end portion of the resistive thin film layer to the third electrode, to generate successive voltage drop from the potential of the third electrode, which is the negative electrode side potential of the bootstrap capacitor, to the potential of the first electrode, which is the ground potential. Because of this, it is possible to maintain an even potential distribution between the first electrode and third electrode. Because of this, compared to the heretofore known high voltage IC, it is possible to suppress the voltage drop amount of the bootstrap capacitor caused by a discharge from the bootstrap capacitor to the ground occurring during the on-state period of an upper arm output power device of an output power device configuring, for example, a PWM inverter bridge circuit.

Also, as it is possible to suppress the voltage drop amount of the bootstrap capacitor more than in the heretofore known high voltage IC, it is possible to reduce the capacity of the bootstrap capacitor compared to that of the heretofore known high voltage IC. Because of this, it is possible to configure the bootstrap capacitor with only a small electronic part such as, for example, a ceramic capacitor, and thus possible to achieve a reduction in PCB area. Also, as it is also possible to reduce the voltage drop amount of the bootstrap capacitor when the upper arm output power device is switching, it is possible to maintain the drive capability of the upper arm output power device.

According to the invention, by providing a resistive thin film layer whose two end portions are connected one each to the first electrode and third electrode in a semiconductor device including a diode structure and a semiconductor device including a transistor structure, it is possible to even the potential distribution in a withstand region formed of the semiconductor device including a diode structure and semiconductor device including a transistor structure. Because of this, it is possible to achieve an increase in the long term reliability of a high temperature bias test, and the like.

According to the semiconductor device according to the invention, an advantage is achieved in that it is possible to maintain the reliability of a high voltage IC. Also, according to the semiconductor device according to the invention, an advantage is achieved in that it is possible to increase breakdown voltage. Also, according to the semiconductor device according to the invention, an advantage is achieved in that it is possible to reduce cost.

BRIEF DESCRIPTION OF THE DRAWINGS

The foregoing advantages and features of the invention will become apparent upon reference to the following detailed description and the accompanying drawings, of which.

DETAILED DESCRIPTION OF SPECIFIC EMBODIMENTS

Hereafter, referring to the attached drawings, a detailed description will be given of preferred embodiments of a semiconductor device according to the invention. In the description and attached drawings, a layer or region being prefixed by n or p indicates that electrons or holes respectively are majority carriers. Also, + or − being added to n or p indicates a higher impurity concentration or lower impurity concentration respectively than that in a layer or region to which neither is added. Also, in the attached drawings, the sectional dimensions and planar dimensions of each layer and each region configuring the semiconductor device are schematic, and differ from the actual dimensions. The same reference signs are given to the same configurations in the following embodiment description and attached drawings, and redundant descriptions are omitted.

Embodiment 1

Figure 1:
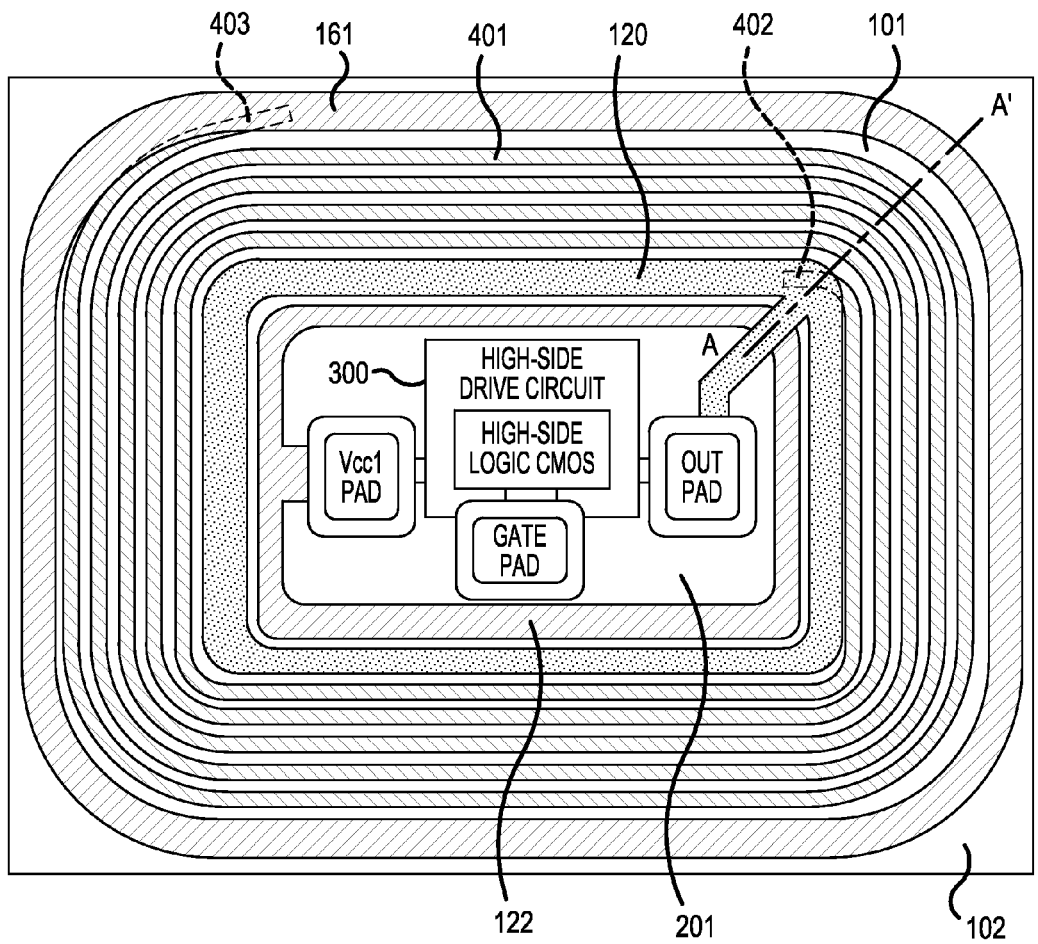
FIG. 1 is a plan view showing a main portion of a high voltage IC according to Embodiment 1.
Figure 2:
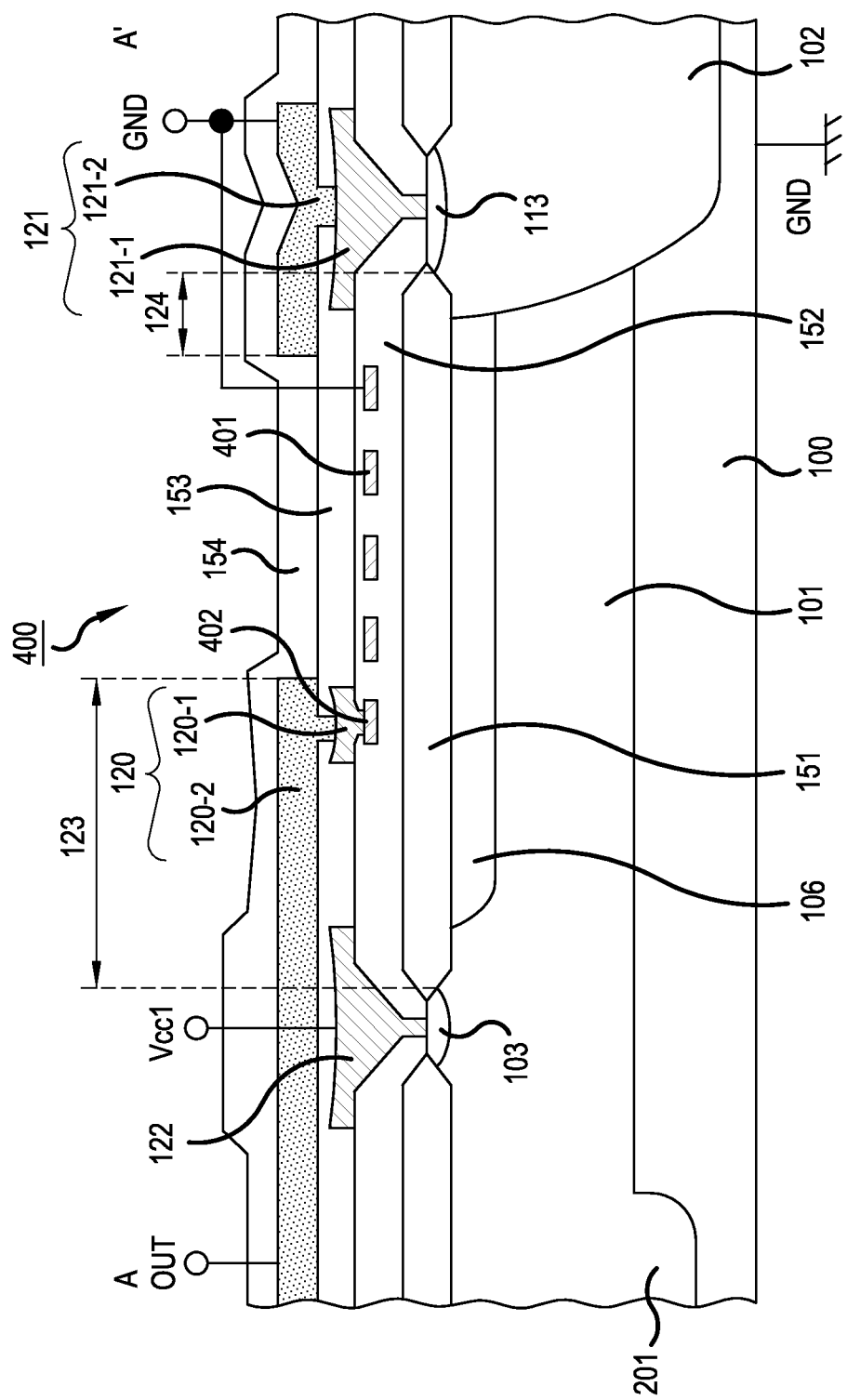
FIG. 2 is a sectional view showing a sectional structure along a cutting plane line A-A' in FIG. 1.
Figure 16:
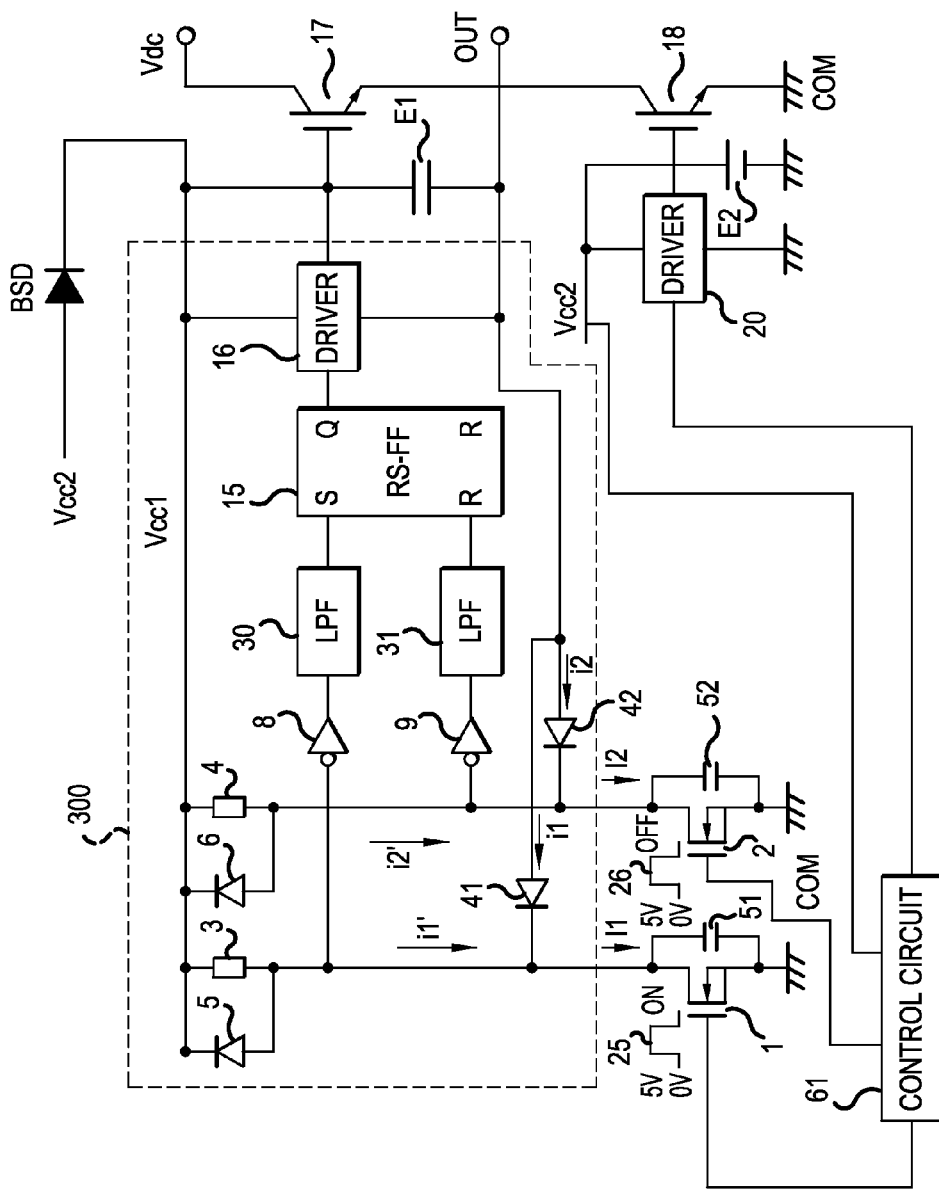
FIG. 16 is a circuit diagram showing a high voltage IC incorporating a general level shift circuit.
Figure 17:
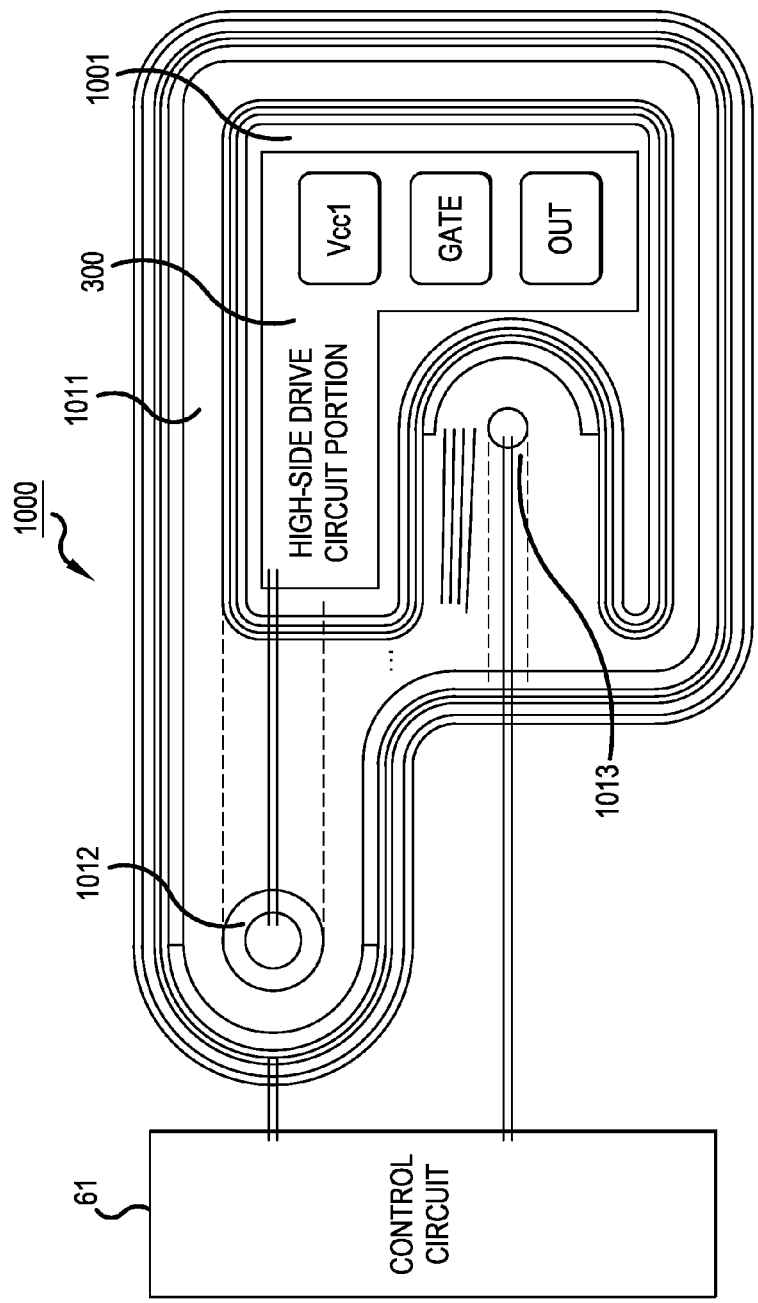
FIG. 17 is a plan view showing a planar structure of a heretofore known high voltage IC.
Figure 18:
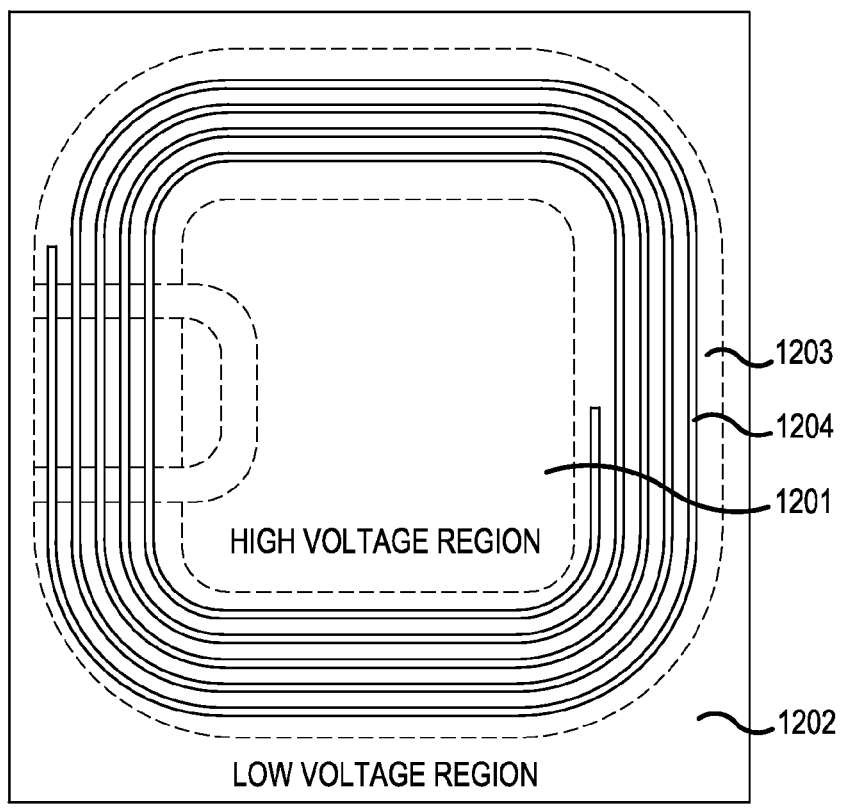
FIG. 18 is a plan view showing a planar structure of a heretofore known resistive field plate structure.
Figure 19:
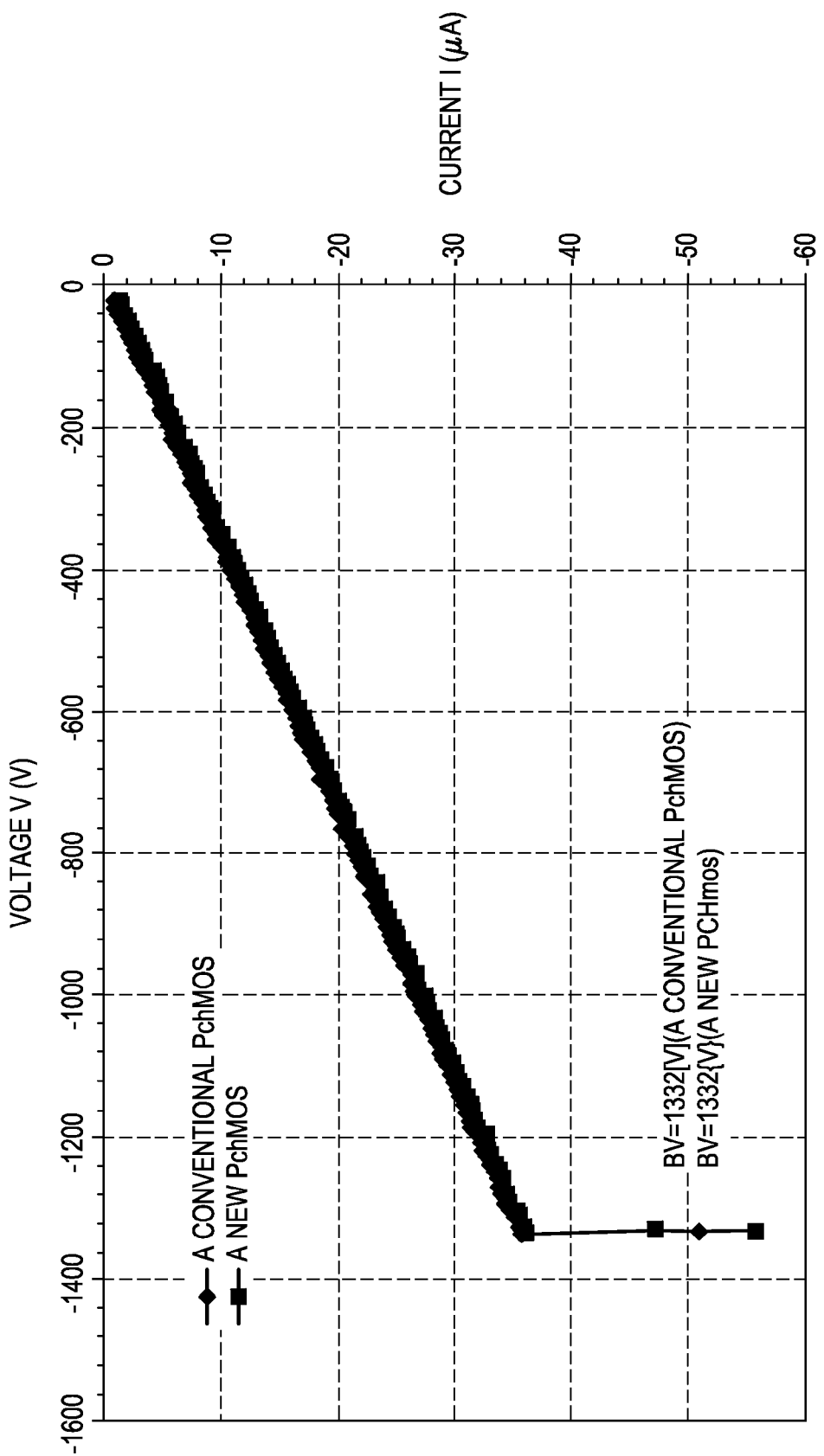
FIG. 19 is an illustration showing breakdown voltage characteristics of a heretofore known high breakdown voltage device.

A description will be given of a high voltage IC according to Embodiment 1, using FIGS. 1, 2, and 16. FIG. 1 is a plan view showing a main portion of a high voltage IC according to Embodiment 1. Also, FIG. 2 is a sectional view showing a sectional structure along a cutting plane line A-A' in FIG. 1. FIG. 1 shows a high-side drive circuit 300 and main portions of a high breakdown voltage junction termination region (HVJT) 400 in the high voltage IC according to Embodiment 1. As shown in FIG. 1, n-type well region 201, n⁻ type region (a second conductivity type well region) 101, and p-type well region (a first conductivity type well region) 102 are disposed on a p⁻ type silicon substrate (a first conductivity type semiconductor layer, not shown).

N-type well region 201 is a region (hereafter referred to as a high potential region) with a potential higher than that of other regions partitioned off by p-type well region 102. High-side drive circuit 300, an OUT pad, a gate pad, and a Vcc1 pad are disposed in n-type well region 201. High-side drive circuit 300 is connected to the OUT pad, gate pad, and Vcc1 pad. A bootstrap circuit is formed of a BSD and a bootstrap capacitor (hereafter referred to as a bootstrap capacitor E1).

High-side drive circuit 300 is the drive circuit of two IGBTs (output power devices) 17, 18 configuring, for example, one phase of a PWM inverter bridge circuit. Specifically, high-side drive circuit 300 is configured of load resistors 3 and 4, constant voltage diodes 5 and 6, NOT circuits 8 and 9 and subsequent stage LPFs 30 and 31, an RS latch 15, driver circuit 16, and the like (refer to FIG. 16). Load resistors 3 and 4 and constant voltage diodes 5 and 6 are connected to the OUT pad and Vcc1 pad. Driver circuit 16 is connected to the gate pad.

The gate of the IGBT 17 of the upper arm of the bridge circuit is electrically connected to the gate pad. The positive electrode of the auxiliary direct current power supply E1 is connected to the Vcc1 pad. The negative electrode of the auxiliary direct current power supply E1 is connected to the OUT pad. The auxiliary direct current power supply E1 is the bootstrap capacitor E1 configuring the bootstrap circuit. The emitter of the IGBT 17 of the upper arm of the bridge circuit and the collector of the IGBT 18 of the lower arm of the bridge circuit are electrically connected to the negative electrode of the auxiliary direct current power supply E1. Because of this, the power supply voltage of the auxiliary direct current power supply E1 changes together with a change in the potential of a connection point of the emitter of the IGBT 17 and the collector of the IGBT 18.

The negative electrode of the auxiliary direct current power supply E1 is connected to a common potential COM via high breakdown voltage MOSFETs 1 and 2. High breakdown voltage MOSFETs 1 and 2 are circuit portions configuring a level shift circuit and, based on turn-off signal 25 and turn-off signal 26 from control circuit 61, input a signal with the potential of the common potential COM as a reference into the level shift circuit. High breakdown voltage MOSFET 1 is energized by set pulse turn-on signal 25 input from control circuit 61. High breakdown voltage MOSFET 2 is energized by the reset pulse turn-off signal 26 input from control circuit 61.

N⁻ type region 101 is in contact with n-type well region 201 and encloses n-type well region 201. A high resistance polysilicon thin film (a resistive thin film layer) 401 configuring a resistive field plate structure of high breakdown voltage junction termination region 400 is disposed on n⁻ type region 101. Also, OUT electrode (third electrode) 120, ground electrode (first electrode) 121, and Vcc1 electrode (second electrode) 122 are disposed on n⁻ type region 101.

Vcc1 electrode 122 is disposed so as to enclose n-type well region 201 on the side of high breakdown voltage junction termination region 400 nearest to n-type well region 201. Vcc1 electrode 122 has a ring-like planar form. One portion of Vcc1 electrode 122 is led out to n-type well region 201 side, and connected to the Vcc1 pad. Vcc1 electrode 122 is connected via the Vcc1 pad to the positive electrode of the auxiliary direct current power supply E1.

OUT electrode 120 is disposed so as to enclose Vcc1 electrode 122 nearer to p-type well region 102 than Vcc1 electrode 122. OUT electrode 120 has a ring-like planar form. Also, one portion of OUT electrode 120 is led out to n-type well region 201 side via an interlayer dielectric (not shown) deposited on Vcc1 electrode 122, and connected to the OUT pad. OUT electrode 120 is connected via the OUT pad to the negative electrode of the auxiliary direct current power supply E1. A voltage lower than the voltage applied to Vcc1 electrode 122 is applied to OUT electrode 120.

High resistance polysilicon thin film 401 is disposed so as to enclose OUT electrode 120 nearer to p-type well region 102 than OUT electrode 122. High resistance polysilicon thin film 401 configures a resistive field plate structure (resistance element) in high breakdown voltage junction termination region 400. It is preferable that high resistance polysilicon thin film 401 is disposed in, for example, a spiral form. High resistance polysilicon thin film 401 is provided across an interlayer dielectric, omitted from the drawings, on the surface (the other surface) of n⁻ type region 101 opposite to the surface (one surface) in contact with the p⁻ type silicon substrate.

The width of high resistance polysilicon thin film 401 in a direction perpendicular to the direction in which high resistance polysilicon thin film 401 spirals may be, for example, 1 μm. The interval between adjacent spiral lines (the spiral interval) of high resistance polysilicon thin film 401 may be, for example, 1 μm. That is, high resistance polysilicon thin film 401 may be disposed in a spiral form to a width of 1 μm and at intervals of 1 μm. High resistance polysilicon thin film 401 is doped with a p-type impurity such as, for example, boron (B) or boron difluoride ($BF_2$) so that the surface concentration is within a range of $1\times10^{17}/cm^3$ to $1\times10^{20}/cm^3$.

One end portion (hereafter referred to as a second contact portion) 403 of high resistance polysilicon thin film 401 is connected to ground electrode 121 through an aperture portion provided in an interlayer dielectric (not shown) deposited on high resistance polysilicon thin film 401. Also, another end portion (hereafter referred to as a first contact portion) 402 of high resistance polysilicon thin film 401 is connected to OUT electrode 120 through an aperture portion provided in an interlayer dielectric (not shown) deposited on high resistance polysilicon thin film 401.

Ground electrode 121 is disposed so as to enclose high resistance polysilicon thin film 401 on the side of high breakdown voltage junction termination region 400 nearest to p-type well region 102. Ground electrode 121 has a ring-like planar form. P-type well region 102 is in contact with $n^-$ type region 101, and encloses $n^-$ type region 101. P-type well region 102 is an element separation region that separates high-side drive circuit 300 and high breakdown voltage junction termination region 400 from other regions (low potential regions).

Next, a description will be given of a sectional structure of high breakdown voltage junction termination region 400 shown in FIG. 1. As shown in FIG. 2, n-type well region 201, $n^-$ type region 101, and p-type well region 102 are each selectively provided in one surface layer of a $p^-$ type silicon substrate 100. $N^-$ type region 101 is in contact with n-type well region 201, and encloses n-type well region 201. P-type well region 102 is in contact with $n^-$ type region 101, and encloses the outer periphery of $n^-$ type region 101 (the side of $n^-$ type region 101 opposite to the side in contact with n-type well region 201).

N-type well region 201 is a diffusion layer formed by an n-type impurity introduced into the $p^-$ type silicon substrate 100 being diffused. N-type well region 201 is such that a diffusion depth Xj thereof is greater than that of $n^-$ type region 101, and the impurity concentration is higher than that of $n^-$ type region 101. As it is sufficient that the impurity concentration of n-type well region 201 is higher than that of $n^-$ type region 101, n-type well region 201 may be provided to a diffusion depth Xj the same as that of $n^-$ type region 101. Specifically, n-type well region 201 is a diffusion layer wherein an n-type impurity such as phosphorus is selectively ion implanted and diffused so that the surface concentration is within a range of $1\times10^{16}/cm^3$ to $1\times10^{19}/cm^3$. The diffusion depth Xj of n-type well region 201 may be, for example, approximately from 10 µm to 15 µm.

$N^-$ type region 101 is a diffusion layer formed by an n-type impurity introduced into the $p^-$ type silicon substrate 100 being diffused. $N^-$ type region 101 may be a diffusion layer wherein an n-type impurity such as phosphorus (P) is ion implanted and diffused so that surface concentration is within a range of $1\times10^{15}/cm^3$ to $1\times10^{16}/cm^3$. The diffusion depth Xj of $N^-$ type region 101 may be, for example, approximately 10 µm. $N^-$ type region 101 may also be an epitaxial layer deposited to a thickness of, for example, approximately 10 µm on $p^-$ type silicon substrate 100. $N^-$ type region 101 is the cathode region of a high breakdown voltage diode configuring high breakdown voltage junction termination region 400.

P-type offset region 106 is selectively provided in a surface layer of $n^-$ type region 101 (the surface layer on the shallow side with respect to the depth direction of $p^-$ type silicon substrate 100). The depth direction is the direction from the main surface on the side of $p^-$ type silicon substrate 100 on which $n^-$ type region 101 is provided toward the main surface on the opposite side. P-type offset region 106 is in contact with p-type well region 102. The diffusion depth Xj of the p-type offset region 106 is less than the diffusion depth Xj of $n^-$ type region 101. It is also acceptable that no p-type offset region 106 is provided. Also, a pickup $n^+$ type region (a second conductivity type high concentration region) 103 is selectively provided in a surface layer of $n^-$ type region 101.

The pickup $n^+$ type region 103 is provided between p-type offset region 106 and n-type well region 201. The pickup $n^+$ type region 103 is not in contact with p-type offset region 106 or n-type well region 201. The pickup $n^+$ type region 103 has an impurity concentration higher than that of $n^-$ type region 101. The pickup $n^+$ type region 103 is a diffusion layer wherein an n-type impurity such as, for example, phosphorus or arsenic (As) is selectively ion implanted and diffused so that the surface concentration is $1\times10^{20}/cm^3$ or higher. The diffusion depth Xj of pickup n+ type region 103 may be, for example, approximately 0.5 µm.

Also, p-type well region 102 is the anode region of the high breakdown voltage diode configuring high breakdown voltage junction termination region 400. P-type well region 102 is in contact with $p^-$ type silicon substrate 100 connected to the potential of the common potential COM. P-type well region 102 is a diffusion layer wherein a p-type impurity such as boron is selectively ion implanted and diffused so that the surface concentration is within a range of $1\times10^{15}/cm^3$ to $1\times10^{19}/cm^3$. The diffusion depth Xj of p-type well region 102 may be, for example, approximately 12 µm.

Pickup $p^+$ type region (a first conductivity type high concentration region) 113 is selectively provided in a surface layer of p-type well region 102. Pickup $p^+$ type region 113 has an impurity concentration higher than that of p-type well region 102. Also, pickup $n^+$ type region 113 is a diffusion region wherein a p-type impurity such as, for example, boron or $BF_2$ is selectively ion implanted and diffused so that the surface concentration is $1\times10^{20}/cm^3$ or higher. The diffusion depth Xj of pickup p+ type region 113 may be, for example, approximately 0.5 µm.

N-type well region 201, $n^-$ type region 101, and p-type well region 102 are covered by LOCOS region 151 formed by a selective thermal oxidation of the silicon surface. Pickup $n^+$ type region 103 and pickup $p^+$ type region 113 are not covered by LOCOS region 151. First interlayer dielectric 152 of, for example, SOG (Spin on Glass: coating type low permittivity interlayer dielectric material), or the like, is deposited on LOCOS region 151.

High resistance polysilicon thin film 401 is provided inside first interlayer dielectric 152. High resistance polysilicon thin film 401 is disposed from n-type well region 201 side to p-type well region 102 side with the spiral lines of high resistance polysilicon thin film 401 at constant spiral intervals. The end portion on OUT electrode 120 side of high resistance polysilicon thin film 401 is first contact portion 402, while the end portion on ground electrode 121 side is second contact portion 403 (refer to FIG. 1). Only first contact portion 402 is shown in FIG. 2. A p-type impurity such as, for example, boron or $BF_2$ is ion implanted into first contact portion 402 and second contact portion 403 so that the surface concentration is $1\times10^{20}/cm^3$ or higher.

A first layer first metal layer (hereafter referred to as a lower layer electrode) 120-1 of OUT electrode 120 is in contact with first contact portion 402 of high resistance polysilicon thin film 401 through an aperture portion provided in first interlayer dielectric 152. A first layer first metal layer (lower layer electrode) 121-1 of ground electrode 121 is in contact with second contact portion 403 of high resistance polysilicon thin film 401 through an aperture portion (not shown) provided in first interlayer dielectric 152. Also, lower layer electrode 121-1 of ground electrode 121 is in contact with pickup $p^+$ type region 113 through an aperture portion of first interlayer dielectric 152.

Vcc1 electrode 122 is in contact with pickup n+ type region 103 through an aperture portion of first interlayer dielectric 152. Lower layer electrode 120-1 of OUT electrode 120, lower layer electrode 121-1 of ground electrode 121, and Vcc1 electrode 122 are formed by a single first metal layer deposited on first interlayer dielectric 152 being patterned. The first metal layer is made of, for example, a metal material with Al (aluminum) as a main element.

Second interlayer dielectric 153 formed of an oxide film layer of, for example, TEOS or the like is deposited on the first metal layer. A second layer second metal layer (hereafter referred to as an upper layer electrode) 120-2 of OUT electrode 120 is in contact with lower layer electrode 120-1 of OUT electrode 120 through a via aperture portion provided in second interlayer dielectric 153. That is, upper layer electrode 120-2 of OUT electrode 120 and first contact portion 402 of high resistance polysilicon thin film 401 are connected via lower layer electrode 120-1 of OUT electrode 120.

Upper layer electrode 120-2 of OUT electrode 120 extends on second interlayer dielectric 153 provided from first contact portion 402 via Vcc1 electrode 122 to n-type well region 201, and is connected to the OUT pad (not shown). Also, upper layer electrode 120-2 of OUT electrode 120 is isolated from Vcc1 electrode 122 by second interlayer dielectric 153. A second layer second metal layer (upper layer electrode) 121-2 of ground electrode 121 is in contact with lower layer electrode 121-1 of ground electrode 121 through a via aperture portion provided in second interlayer dielectric 153.

A portion of upper layer electrode 120-2 of OUT electrode 120 nearer p-type well region 102 than p-type well region 102 side end portion of pickup n+ type region 103 is metal field plate 123 of high breakdown voltage junction termination region 400. A portion of upper layer electrode 121-2 of ground electrode 121 nearer n-type well region 201 than n-type well region 201 side end portion of pickup p+ type region 113 is metal field plate 124 of high breakdown voltage junction termination region 400.

Upper layer electrode 120-2 of OUT electrode 120, upper layer electrode 121-2 of ground electrode 121, and metal field plates 123 and 124 of high breakdown voltage junction termination region 400 are formed by a single second metal layer deposited on second interlayer dielectric 153 being patterned. The second metal layer is made of, for example, a metal material with Al as a main element. Passivation film 154 formed of a silicon nitride film is deposited on the second metal layer as a protective film of the high voltage IC. Metal field plates 123 and 124 are isolated from each other by passivation film 154.

Next, a description will be given of a method of manufacturing the high voltage IC shown in FIGS. 1 and 2. Firstly, n− type region 101, n-type well region 201, and p-type well region 102 are formed in a surface layer of the p− type silicon substrate 100. In order to unify the manufacturing steps thereof, n− type region 101, n-type well region 201, and p-type well region 102 are formed collectively at a high temperature of 1,100° C. or more, and so as to have a predetermined diffusion depth Xj in a nitrogen atmosphere.

Next, LOCOS region 151 is formed on the surfaces of n-type well region 201, n− type region 101, and p-type well region 102 by a selective thermal oxidation of the silicon surface in a high temperature thermal oxidation step. At this time, LOCOS region 151 is not formed in a region of n− type region 101 in which pickup n+ region 103 is to be formed or in a region of p-type well region 102 in which pickup p+ region 113 is to be formed. Next, first interlayer dielectric 152 of, for example, an SOG film or the like is deposited on LOCOS region 151 so that pickup n+ region 103 and pickup p+ region 113 are exposed.

Next, high resistance polysilicon thin film 401 is deposited on first interlayer dielectric 152. High resistance polysilicon thin film 401 is doped with a p-type impurity such as, for example, boron or $BF_2$ so that the surface concentration becomes a predetermined impurity concentration, and high resistance polysilicon thin film 401 functions as a resistance element. Next, a resist mask patterned so that high resistance polysilicon thin film 401 is disposed in a spiral form to a desired width and at desired spiral intervals is formed on the surface of high resistance polysilicon thin film 401.

Then, etching is carried out with the resist mask as a mask, thus patterning high resistance polysilicon thin film 401. By so doing, high resistance polysilicon thin film 401 is disposed in a spiral form. Subsequently, the resist mask is removed by an ashing process. Next, a p-type impurity such as, for example, boron or $BF_2$ is ion implanted into the region in which pickup p+ type region 113 is to be formed (the portion of p-type well region 102 not covered by LOCOS region 151 or first interlayer dielectric 152) and into the first and second contact portions 402 and 403 of high resistance polysilicon thin film 401.

Next, an n-type impurity such as, for example, phosphorus or arsenic is ion implanted into the region in which pickup n+ type region 103 is to be formed (the portion of n− type region 101 not covered by LOCOS region 151 or first interlayer dielectric 152). Then, an annealing process is carried out. By so doing, pickup p+ type region 113 is formed to a desired diffusion depth Xj in a surface layer of p-type well region 102. Pickup n+ type region 103 is formed to a desired diffusion depth Xj in a surface layer of n− type region 101. The surface concentration of the first and second contact portions 402 and 403 of high resistance polysilicon thin film 401 becomes a predetermined impurity concentration.

Next, an oxide film layer of, for example, BPSG (Boro-Phospho Silicate Glass) or the like, which is to become first interlayer dielectric 152, is deposited on high resistance polysilicon thin film 401. The oxide film layer is deposited so that pickup n+ type region 103 and pickup p+ type region 113 are exposed. Then, a first contact etching is carried out, selectively opening first interlayer dielectric 152 deposited on high resistance polysilicon thin film 401, and exposing first and second contact portions 402 and 403.

Next, the first metal layer is deposited on first interlayer dielectric 152 using a sputtering method, thereby embedding the first metal layer in the plurality of aperture portions in first interlayer dielectric 152. Next, the first metal layer is patterned by metal etching, thereby forming lower layer electrode 120-1 of OUT electrode 120 in contact with first contact portion 402, lower layer electrode 121-1 of ground electrode 121 in contact with second contact portion 403 and pickup p+ type region 113, Vcc1 electrode 122 in contact with pickup n+ type region 103, and the like.

Next, second interlayer dielectric 153 formed of an oxide film layer of, for example, TEOS (Tetra Ethyl Ortho Silicate) or the like is deposited on the first metal layer using, for example, a plasma CVD (PECVD: Plasma-Enhanced Chemical Vapor Deposition) method. Then, via aperture portions are formed by via etching in connection points of second interlayer dielectric 153 with the first metal layer and second metal layer.

Next, the second metal layer is deposited on second interlayer dielectric 153 using a sputtering method, thereby embedding the second metal layer in the plurality of aperture portions in second interlayer dielectric 153. Next, the second metal layer is patterned by metal etching, thereby forming upper layer electrode 120-2 of OUT electrode 120, upper layer electrode 121-2 of ground electrode 121, metal field plates 123 and 124 of high breakdown voltage junction termination region 400, and the like.

The second metal layer is patterned so that an end portion of the second metal layer on n-type well region 201 side is led out via second interlayer dielectric 153 onto Vcc1 electrode 122, and connected to the OUT pad (not shown). Because of this, n-type well region 201 side of the second metal layer becomes OUT electrode 120. As the difference in potential between Vcc1 electrode 122 and OUT electrode 120 is approximately from 15 V to 30 V, it is preferable that the thickness of second interlayer dielectric 153 sandwiched between Vcc1 electrode 122 and OUT electrode 120 is 1,000 Å or more in order to avoid dielectric breakdown of second interlayer dielectric 153. Subsequently, passivation film 154 formed of a silicon nitride film is deposited as a protective film of the high voltage IC. By so doing the high voltage IC shown in FIG. 1 is completed.

Next, a description will be given of the reliability of the high voltage IC shown in FIG. 1. A high breakdown voltage is required of high breakdown voltage junction termination region 400. The reason for this is that, in response to a switching of upper arm IGBT 17 connected to a high pressure main direct current power supply Vdc, the potential of an OUT terminal is raised as far as the potential of the main direct current power supply Vdc, as heretofore described. The high voltage IC according to Embodiment 1 is such that metal field plates 123 and 124 connected to OUT electrode 120 and ground electrode 121 respectively, and high resistance polysilicon thin film 401, are provided in high breakdown voltage junction termination region 400. Because of this, it is possible to adjust a high voltage applied in the high voltage IC to an even potential distribution with a minute current, using high resistance polysilicon thin film 401 configuring the resistive field plate structure on high breakdown voltage junction termination region 400. Because of this, the adverse effects of movable ions, charge accumulation, and the like, from the mold resin on the breakdown voltage characteristics of the high voltage IC are reduced, and it is thus possible to satisfy long term reliability of a high temperature bias test, and the like.

Also, the high voltage IC according to Embodiment 1 is such that it is possible to suppress a voltage drop caused by a discharge of the bootstrap capacitor E1 configuring the auxiliary direct current power supply E1. The reason for this is that, by connecting high resistance polysilicon thin film 401 configuring the resistive field plate structure on high breakdown voltage junction termination region 400 to OUT electrode 120 and ground electrode 121, it is possible to reduce discharge paths of the bootstrap capacitor E1 with respect to a heretofore known high voltage IC (refer to FIG. 15). A description will be given, using FIG. 3, of the discharge paths of the bootstrap capacitor E1.

Figure 3:
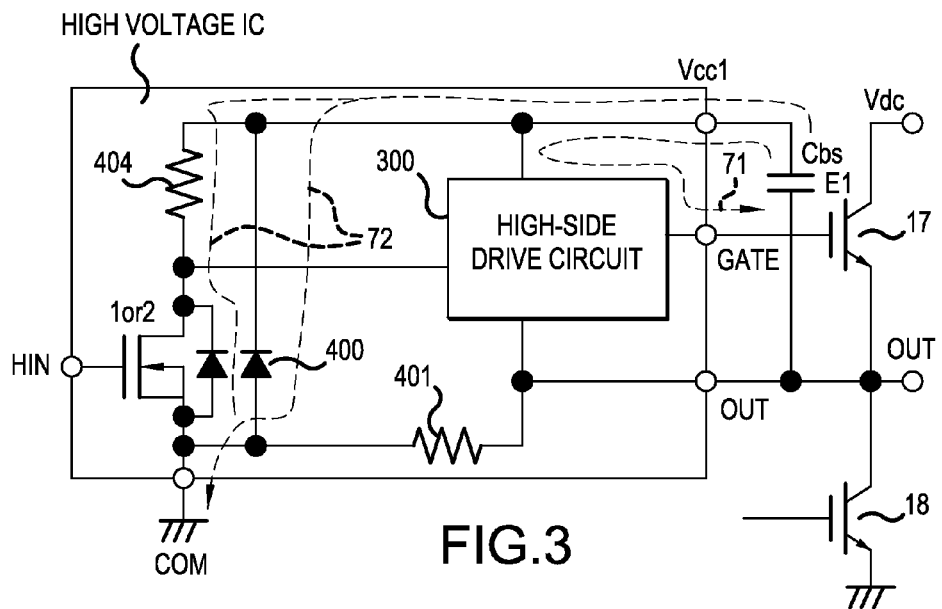
FIG. 3 is an illustration showing discharge paths of a bootstrap capacitor of the high voltage IC according to Embodiment 1.

FIG. 3 is an illustration showing the discharge paths of the bootstrap capacitor of the high voltage IC according to Embodiment 1. As shown in FIG. 3, the only discharge paths of the bootstrap capacitor E1 are first and second paths 71 and 72. Because of this, the high voltage IC according to Embodiment 1 is such that it is possible to eliminate the discharge along a third path 73 of the bootstrap capacitor E1 of the heretofore known high voltage IC. The first path 71 (indicated by a dotted line arrow) is the path of a current flowing when applying a gate voltage to upper arm IGBT 17 via the positive electrode line Vcc1 and high-side drive circuit 300.

The second path 72 (indicated by a coarser arrow than that of reference sign 71) is the path of the reverse leakage current of the high breakdown voltage diode 400 configuring the high breakdown voltage junction termination region connected between the positive electrode line Vcc1 of the high voltage IC and the ground (the common potential COM). The paths of the reverse leakage current of a level shifter element (the constant voltage diodes 5 and 6 of FIG. 16) 404 connected in parallel via a level shift resistor (the load resistors 3 and 4 of FIG. 16) to the high breakdown voltage diode 400, and of the body diodes of high breakdown voltage MOSFETs 1 and 2, are also included in the second path 72.

As the high voltage IC according to Embodiment 1 is such that it is possible to eliminate the discharge along the third path 73 of the bootstrap capacitor E1 of the heretofore known high voltage IC, it is possible to reduce a voltage drop amount ΔVbs of the bootstrap capacitor E1. Specifically, the voltage drop amount ΔVbs of the bootstrap capacitor E1 caused by the discharge along the third path 73 in the heretofore known high voltage IC shown in FIG. 15 will be calculated and described based on Equation (1). The values of the variables used in Equation (1) have the following conditions.

The carrier frequency of a switching operation of upper arm IGBT 17 is taken to be 2 kHz. In this case, the period for which upper arm IGBT 17 is in an on-state (the on-state period) is taken to be 0.5 ms. Also, normally, a capacity of a value approximately 10 times higher than a gate capacity Cg of a power device (IGBT or MOSFET) to be driven is selected as a capacity Cbs of the bootstrap capacitor E1. Because of this, the gate capacity Cg of IGBT 17 is taken to be 1,000 pF, while the capacity Cbs of the bootstrap capacitor E1 is taken to be 10 nF. Although the leakage current of high resistance polysilicon thin film 401 portion changes in accordance with the transiently rising potential of Vcc1 electrode 122 and the potential of OUT electrode 120, it is taken here to be a simplified 40 μA.

Figure 15:
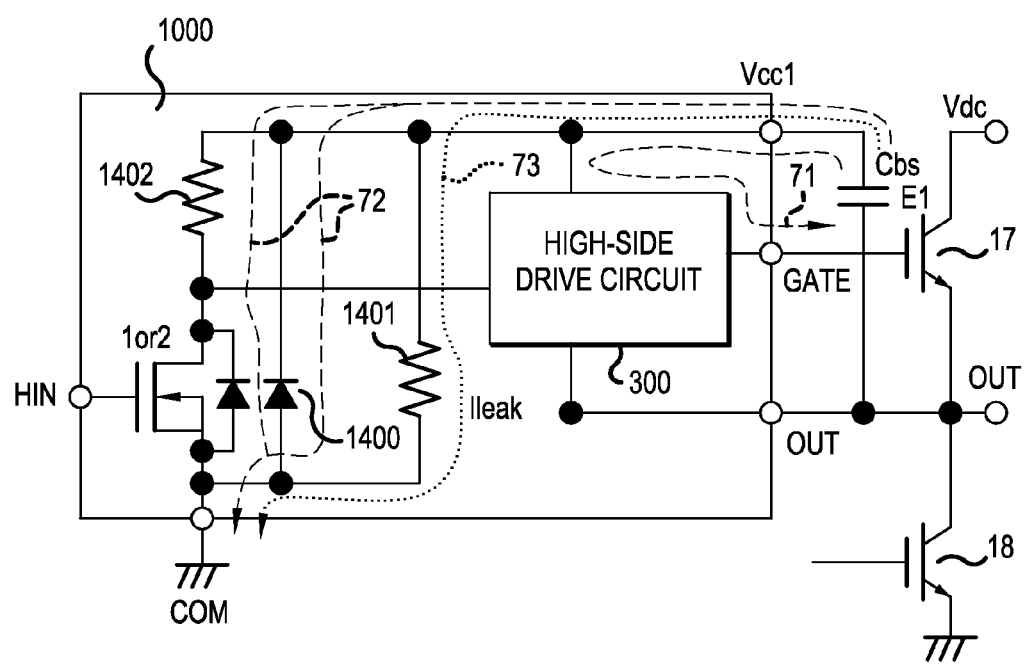
FIG. 15 is an illustration showing discharge paths of a bootstrap capacitor of a heretofore known high voltage IC.

Under the above conditions, the voltage drop amount ΔVbs of the bootstrap capacitor E1 caused by the third path 73 in the heretofore known high voltage IC shown in FIG. 15 is 2.0 V (refer to Equation (4) below). Consequently, the heretofore known high voltage IC shown in FIG. 15 is such that the drive capability of upper arm IGBT 17, which should normally be gate driven at approximately 14.4 V, drops to 12.4 V (=14.4 V−2.0 V).

[Math. 2]

$$\Delta Vbs = \left\{ \int_{t1}^{t2} Ileak \cdot dt \right\} \bigg/ Cbs \quad (4)$$
$$= (40 \times 10^{-6} \times 0.510^{-3}) / 10 \times 10^{-9}$$
$$= 2.0 (V)$$

Meanwhile, as the high voltage IC according to Embodiment 1 is such that the bootstrap capacitor E1 is not discharged along the third path 73, the 2.0 V voltage drop does not occur. Consequently, it is possible to maintain the drive capability of upper arm IGBT 17.

Also, as high resistance polysilicon thin film 401 is disposed between OUT electrode 120 and ground electrode 121, a minute current flows from OUT electrode 120 to ground electrode 121 for the on-state period of upper arm IGBT 17. However, as upper arm IGBT 17 is in an on-state at this time, the potential of OUT electrode 120 is practically the same as the potential of the main direct current power supply Vdc, and a minute current is supplied from the main direct current power supply Vdc side to ground electrode 121. As the potential difference of the bootstrap capacitor E1 is maintained because of this, no voltage drop due to discharge occurs.

As heretofore described, according to the high voltage IC according to Embodiment 1, a high breakdown voltage diode structure is adopted as high breakdown voltage junction termination region 400 of the high voltage IC, and the resistive high resistance polysilicon thin film 401 is disposed on the high breakdown voltage diode. Further, one end portion (second contact portion 403) of high resistance polysilicon thin film 401 is connected to ground electrode 121, while the other end portion (first contact portion 402) of high resistance polysilicon thin film 401 is connected to OUT electrode 120, which is connected to the negative electrode side of the bootstrap capacitor E1. Because of this, for example, it is possible to suppress the voltage drop amount ΔVbs of the bootstrap capacitor E1 caused by discharge from the bootstrap capacitor E1 to the ground occurring in the on-state period of upper arm IGBT 17 in the output power device configuring the PWM inverter bridge circuit more than in the heretofore known high voltage IC. Consequently, it is possible to maintain the reliability of the high voltage IC, and to increase the breakdown voltage.

Also, as it is possible to suppress the voltage drop amount ΔVbs of the bootstrap capacitor E1 more than in the heretofore known high voltage IC, it is possible to reduce the capacity Cbs of the bootstrap capacitor E1 compared to that in the heretofore known high voltage IC. Because of this, it is possible to configure the bootstrap circuit with only a small electronic part such as, for example, a ceramic capacitor, and thus possible to achieve a reduction in the area of the PCB. Consequently, it is possible to reduce the cost. Also, as it is possible to reduce the voltage drop amount ΔVbs of the bootstrap capacitor E1 when upper arm IGBT 17 is switching, it is possible to maintain the drive capability of upper arm IGBT 17. Consequently, it is possible to maintain the reliability of the high voltage IC.

Embodiment 2

Figure 4:
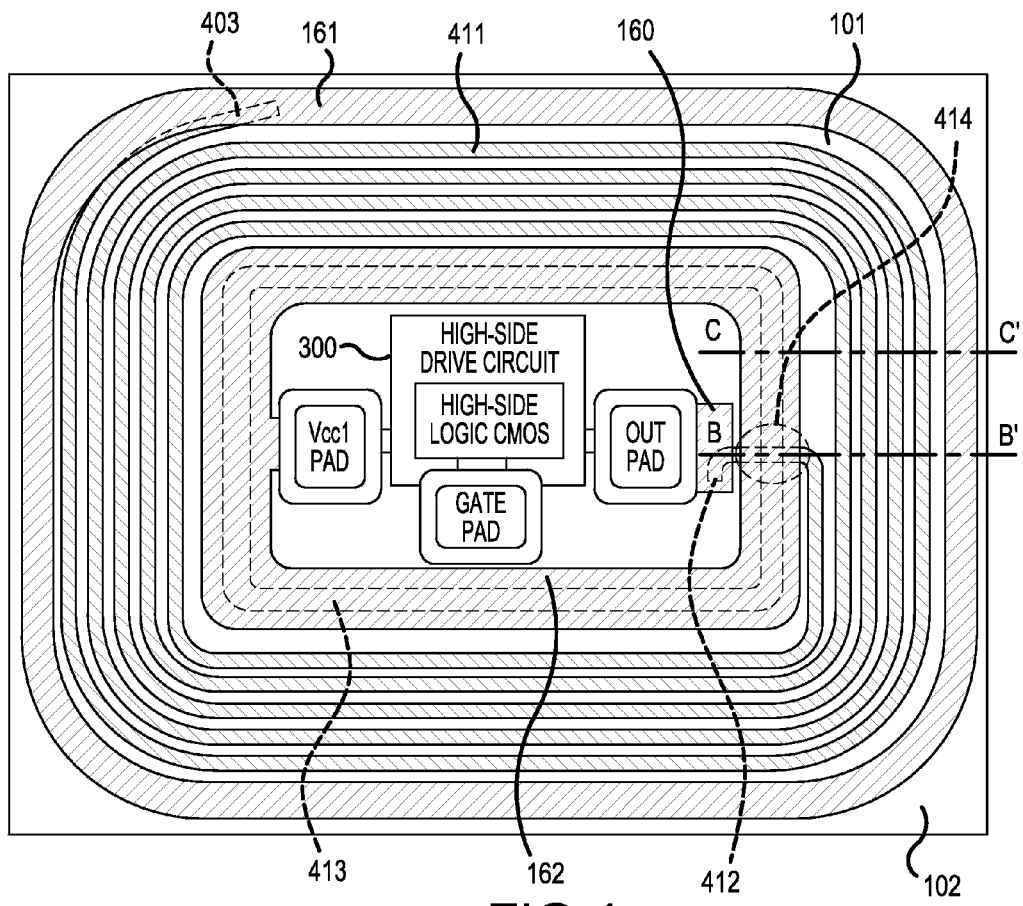
FIG. 4 is a plan view showing a main portion of a high voltage IC according to Embodiment 2.
Figure 5:
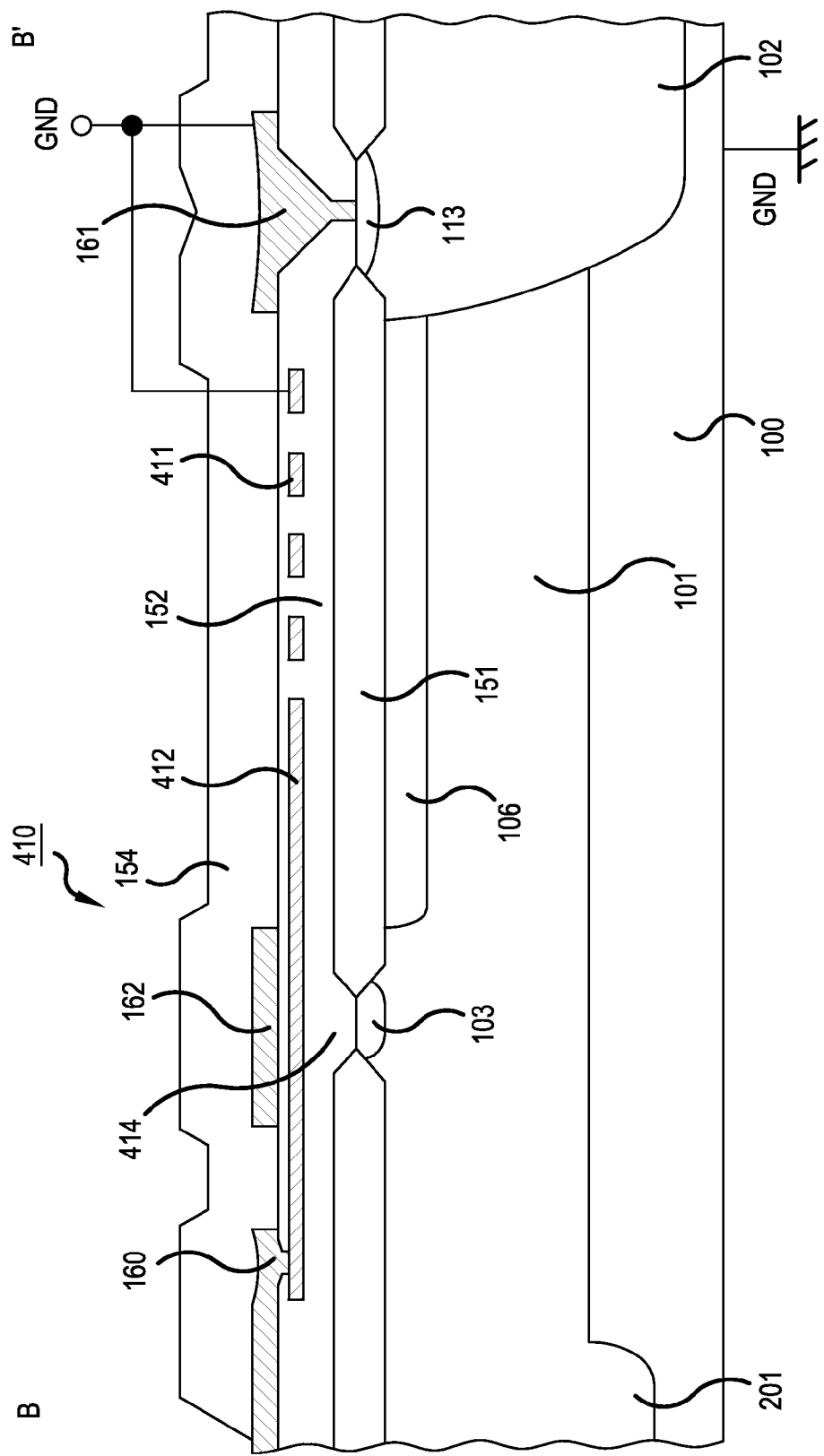
FIG. 5 is a sectional view showing a sectional structure along a cutting plane line B-B' in FIG. 4.
Figure 6:
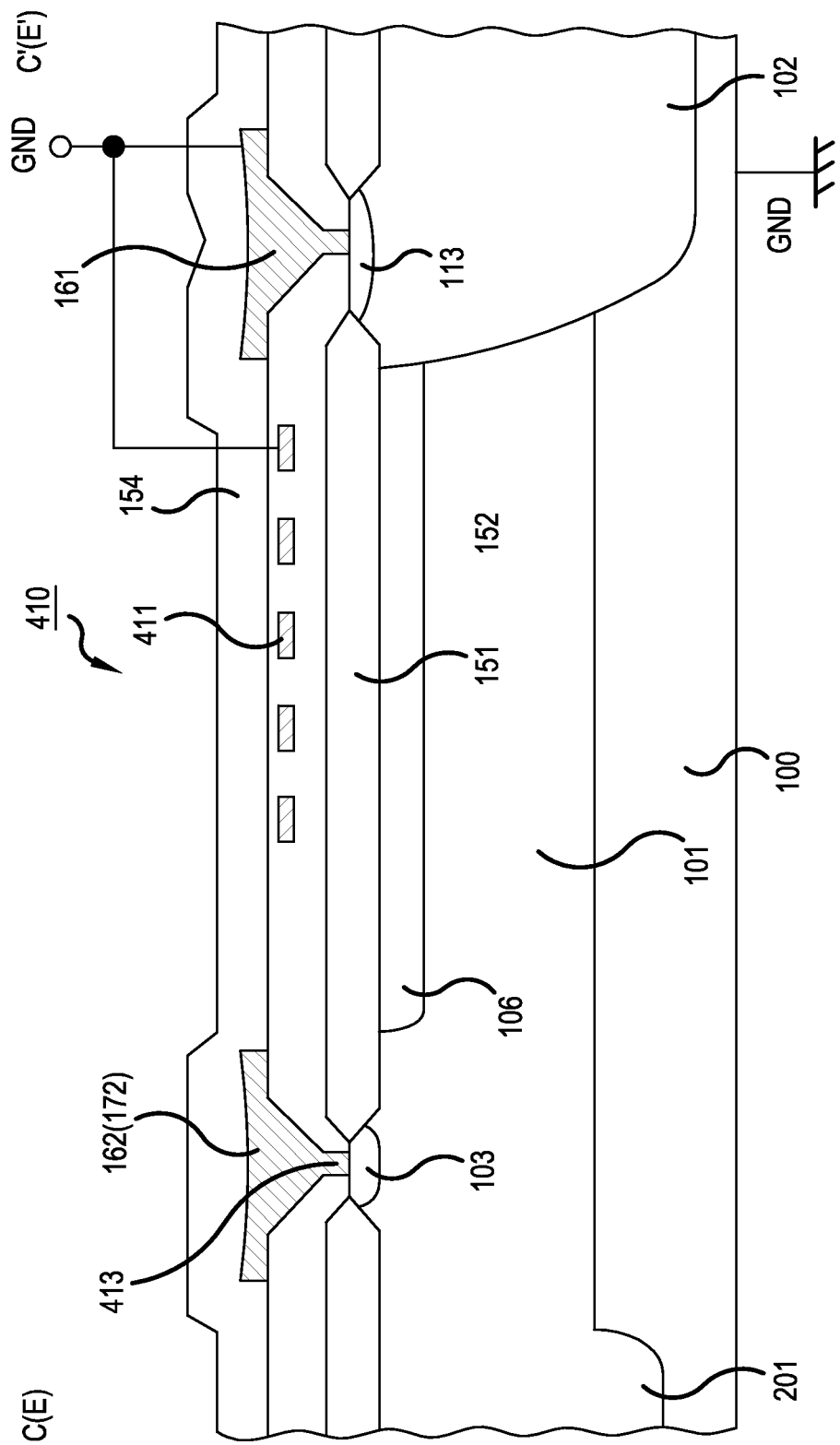
FIG. 6 is a sectional view showing a sectional structure along a cutting plane line C-C' in FIG. 4.

FIG. 4 is a plan view showing a main portion of a high voltage IC according to Embodiment 2. Also, FIG. 5 is a sectional view showing a sectional structure along a cutting plane line B-B' in FIG. 4. FIG. 6 is a sectional view showing a sectional structure along a cutting plane line C-C' in FIG. 4. FIG. 4 shows high-side drive circuit 300 and main portions of a high breakdown voltage junction termination region 410 in the high voltage IC according to Embodiment 2. The high voltage IC according to Embodiment 2 differs from Embodiment 1 in that first contact portion 412 of a high resistance polysilicon thin film 411 configuring a resistive field plate structure is connected to OUT electrode 160 formed of a first metal layer.

As shown in FIGS. 4 to 6, the high voltage IC according to Embodiment 2 is such that OUT electrode 160 is disposed on n-type well region 201. OUT electrode 160, being configured of only the first metal layer, does not have an upper layer electrode formed of a second metal layer. Vcc1 electrode 162 is in contact via a contact portion (hereafter referred to as a pickup contact portion) 413 with pickup $n^+$ type region 103 provided in $n^-$ type region 101.

Pickup contact portion 413 has a ring-like planar form wherein one portion is opened. Vcc1 electrode 162 is not in contact with pickup $n^+$ type region 103 in a portion (hereafter referred to simply as a portion in which pickup contact portion 413 is not provided) 414 of first interlayer dielectric 152 between Vcc1 electrode 162 and pickup $n^+$ type region 103 in which pickup contact portion 413 is not provided. That is, Vcc1 electrode 162 is deposited on first interlayer dielectric 152 in portion 414 in which pickup contact portion 413 is not provided.

High resistance polysilicon thin film 411 is disposed on p-type well region 102 side of Vcc1 electrode 162. First contact portion 412 of high resistance polysilicon thin film 411 is led out to n-type well region 201 side in portion 414 in which pickup contact portion 413 is not provided, and connected to OUT electrode 160. Specifically, first contact portion 412 of high resistance polysilicon thin film 411 is led out in first interlayer dielectric 152 between Vcc1 electrode 162 and pickup $n^+$ type region 103 in portion 414 in which pickup contact portion 413 is not provided, and extends to n-type well region 201 side.

That is, first contact portion 412 of high resistance polysilicon thin film 411 and Vcc1 electrode 162 are isolated from each other by first interlayer dielectric 152. The thickness of first interlayer dielectric 152 between first contact portion 412 of high resistance polysilicon thin film 411 and Vcc1 electrode 162 may be a thickness such that there is no dielectric breakdown due to the difference between the potential of Vcc1 electrode 162 and the potential of OUT electrode 160 (approximately from 15 V to 30 V), for example, approximately 1 μm.

Configurations of the high voltage IC according to Embodiment 2 other than the heretofore described configurations of OUT electrode 160, Vcc1 electrode 162, and high resistance polysilicon thin film 411 are the same as those of the high voltage IC according to Embodiment 1. With regard to a method of manufacturing the high voltage IC according to Embodiment 2, it is sufficient that high resistance polysilicon thin film 411 is patterned in a desired pattern. Also, it is sufficient that first interlayer dielectric 152 is patterned in a desired pattern, thereby forming pickup contact portion 413. Furthermore, it is sufficient that the first metal layer is patterned in a desired pattern, thereby forming OUT electrode 160 and ground electrode 161. Steps in the method of manufacturing the high voltage IC according to Embodiment 2 other than the patterning of high resistance polysilicon thin film 411, first metal layer, and first interlayer dielectric 152 are the same as with the method of manufacturing the high voltage IC according to Embodiment 1.

As heretofore described, according to the high voltage IC according to Embodiment 2, it is possible to obtain the same advantages as with the high voltage IC according to Embodiment 1. Also, according to Embodiment 2, first contact portion 412 of high resistance polysilicon thin film 411 is connected to OUT electrode 160 formed of the first metal layer, and second contact portion 403 of high resistance polysilicon thin film 411 is connected to ground electrode 161. Because of this, it is possible to connect high resistance polysilicon thin film 411 configuring the resistive field plate with OUT electrode 160 and ground electrode 161 with only the first metal layer. Consequently, it is possible to reduce the manufacturing cost.

Embodiment 3

Figure 7:
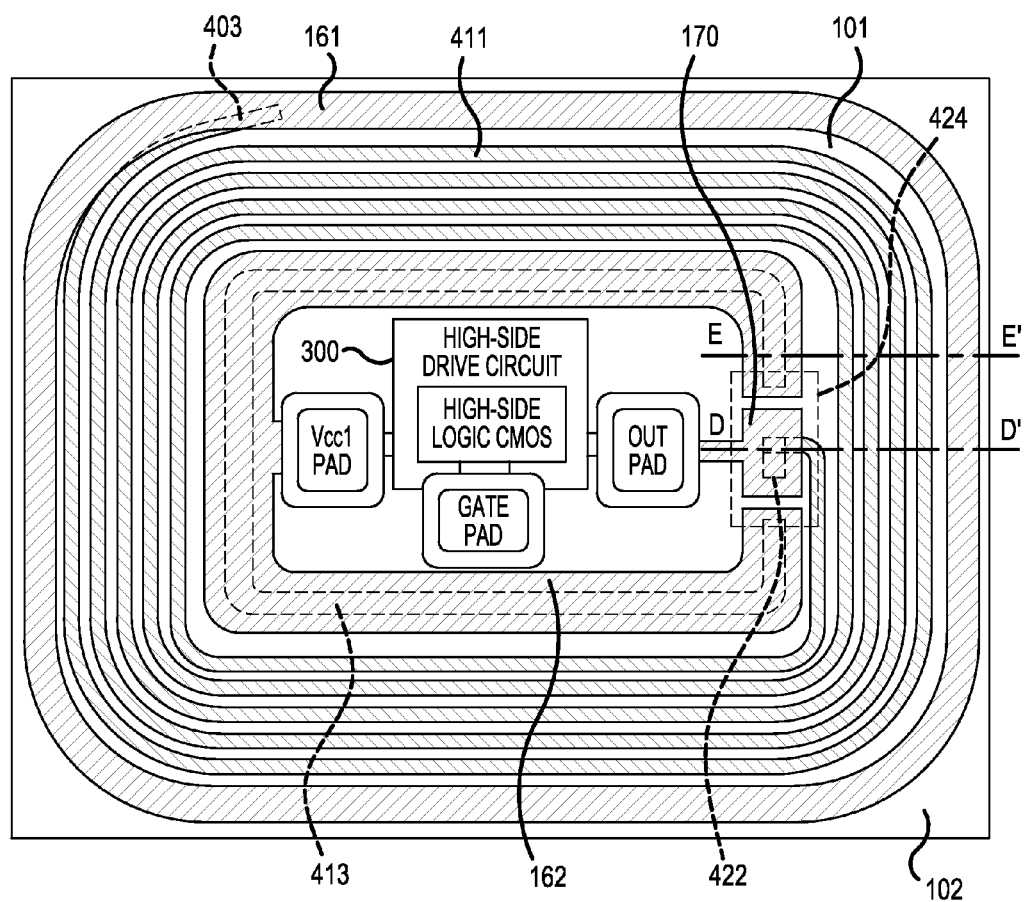
FIG. 7 is a plan view showing a main portion of a high voltage IC according to Embodiment 3.
Figure 8:
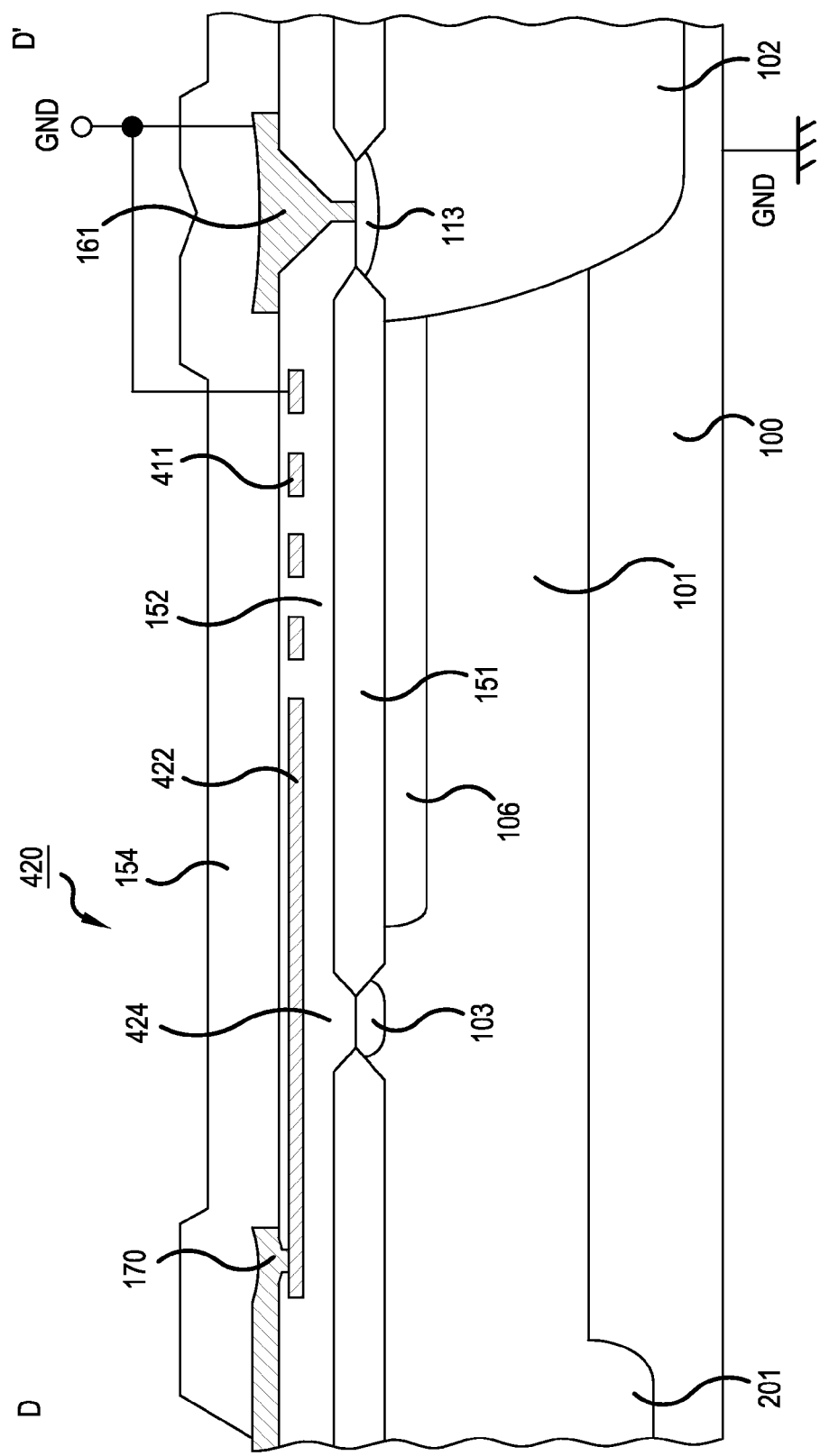
FIG. 8 is a sectional view showing a sectional structure along a cutting plane line D-D' in FIG. 7.

FIG. 7 is a plan view showing a main portion of a high voltage IC according to Embodiment 3. Also, FIG. 8 is a sectional view showing a sectional structure along a cutting plane line D-D' in FIG. 7. FIG. 7 shows high-side drive circuit 300 and main portions of high breakdown voltage junction termination region 420 in the high voltage IC according to Embodiment 3. A sectional structure along a cutting plane line E-E' in FIG. 7 is the same as the sectional structure shown in FIG. 6. The high voltage IC according to Embodiment 3 is a modification example of the high voltage IC according to Embodiment 2. The high voltage IC according to Embodiment 3 differs from Embodiment 2 in that, in portion 424 in which pickup contact portion 413 is not provided, no Vcc1 electrode 172 is provided either.

As shown in FIGS. 7 and 8, the high voltage IC according to Embodiment 3 is such that Vcc1 electrode 172, in the same way as pickup contact portion 413, has a ring-like planar form wherein one portion is opened. That is, Vcc1 electrode 172 does not exist on first interlayer dielectric 152 in portion 424 in which pickup contact portion 413 is not provided. Further, OUT electrode 170 is disposed in portion 424 in which pickup contact portion 413 is not provided. That is, OUT electrode 170 is disposed on n⁻ type region 101, as in the high voltage IC according to Embodiment 1.

First contact portion 422 of high resistance polysilicon thin film 411 is led out to portion 424 in which pickup contact portion 413 is not provided, and connected to OUT electrode 170. Specifically, first contact portion 422 of high resistance polysilicon thin film 411 is led out in first interlayer dielectric 152 of portion 424 in which pickup contact portion 413 is not provided.

Configurations of the high voltage IC according to Embodiment 3 other than the heretofore described configurations of OUT electrode 170, Vcc1 electrode 172, and high resistance polysilicon thin film 411 are the same as those of the high voltage IC according to Embodiment 2. With regard to a method of manufacturing the high voltage IC according to Embodiment 3, it is sufficient that high resistance polysilicon thin film 411 is patterned in a desired pattern. Also, it is sufficient that the first metal layer is patterned in a desired pattern, thereby forming OUT electrode 170 and Vcc1 electrode 172. The steps of patterning high resistance polysilicon thin film 411 and first metal layer with the method of manufacturing the high voltage IC according to Embodiment 3 are the same as with the method of manufacturing the high voltage IC according to Embodiment 2.

As heretofore described, according to the high voltage IC according to Embodiment 3, it is possible to obtain the same advantages as with the high voltage IC according to Embodiment 2.

Embodiment 4

Figure 9:
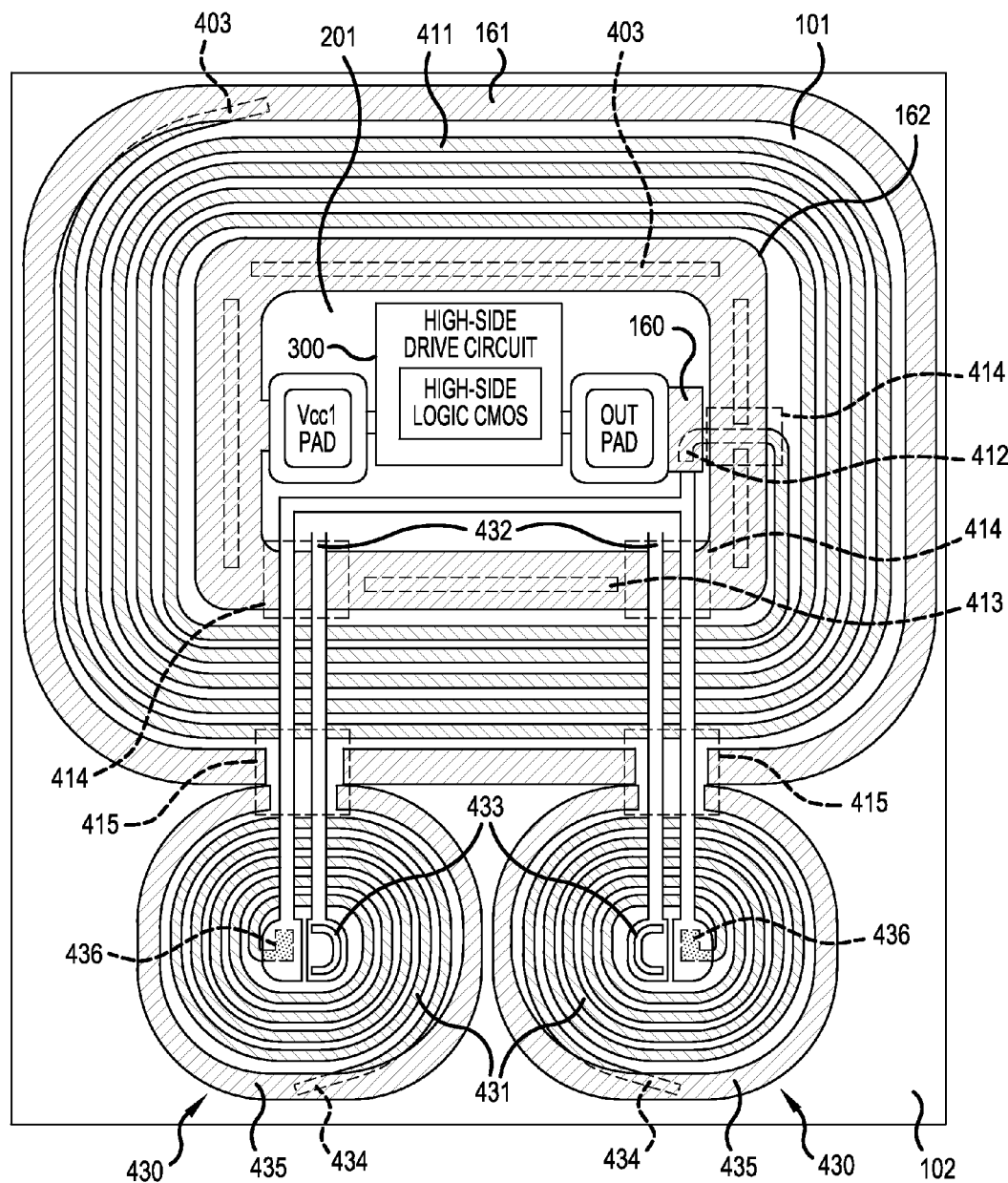
FIG. 9 is a plan view showing a main portion of a high voltage IC according to Embodiment 4.

FIG. 9 is a plan view showing a main portion of a high voltage IC according to Embodiment 4. FIG. 9 shows high-side drive circuit 300, a high breakdown voltage junction termination region, and main portions of a high breakdown voltage transistor (a high breakdown voltage n-type channel MOSFET) in the high voltage IC according to Embodiment 4. High voltage IC according to Embodiment 4 is a modification example of the high voltage IC according to Embodiment 2. The high voltage IC according to Embodiment 4 differs from Embodiment 2 in that high breakdown voltage n-type channel MOSFET (two-input type) 430 is provided on p-type well region 102, and high breakdown voltage n-type channel MOSFET 430 and high breakdown voltage junction termination region are connected by drain wiring 432.

As shown in FIG. 9, the high voltage IC according to Embodiment 4 is such that two of high breakdown voltage n-type channel MOSFET 430 are provided on p-type well region 102. The two high breakdown voltage n-type channel MOSFETs 430 correspond respectively to, for example, the high breakdown voltage MOSFETs 1 and 2 configuring the level shift circuit shown in FIG. 16. Drain wiring 432 of high breakdown voltage n-type channel MOSFET 430 is provided on a first interlayer dielectric (not shown) so as to cross a ground region, and is led out to n-type well region 201 side.

It is preferable that the first interlayer dielectric on which drain wiring 432 is formed is provided to a thickness of, for example, approximately 2 μm to 3 μm in a common 600 V breakdown voltage class of high voltage IC in order to avoid dielectric breakdown. The ground region is a region in which is provided ground electrode 161 enclosing high resistance polysilicon thin film 411 of the high breakdown voltage junction termination region. Ground electrode 161 has a ring-like planar form wherein one portion is opened, and is not provided in portion 415 of the ground region crossed by drain wiring 432.

One end portion of drain wiring 432 of high breakdown voltage n-type channel MOSFET 430 is connected via drain contact portion 433 to the drain region (not shown) of high breakdown voltage n-type channel MOSFET 430. The other end portion of drain wiring 432 is connected to high-side drive circuit 300. Specifically, the other end portion of drain wiring 432 is connected to n-type well region 201.

Also, high resistance polysilicon thin film 411 configuring the resistive field plate structure of the high breakdown voltage junction termination region is connected to the other end portion side of drain wiring 432. Specifically, one portion of the spiral lines of high resistance polysilicon thin film 411 on p-type well region 102 side (high potential side) is led out in the first interlayer dielectric (not shown) between Vcc1 electrode 162 and a pickup n⁺ type region in portion 414 in which pickup contact portion 413 is not provided. Further, drain wiring 432 is connected to high potential side high resistance polysilicon thin film 411 led out in the first interlayer dielectric, and thus connected to OUT electrode 160 via high potential side high resistance polysilicon thin film 411.

The thickness of first interlayer dielectric between Vcc1 electrode 162 and pickup n⁺ type region in portion 414 in which pickup contact portion 413 is not provided may be a thickness such that there is no dielectric breakdown of the first interlayer dielectric due to the difference in potential between Vcc1 electrode 162 and OUT electrode 160 (approximately from 15 V to 30 V), for example, approximately 1 μm. A plurality of portion 414 in which pickup contact portion 413 is not provided are provided. Portion 414 in which pickup contact portion 413 is not provided and into which the high potential side spiral line of high resistance polysilicon thin film 411 is led out differs from portion 414 in which pickup contact portion 413 is not provided and into which first contact portion 412 of high resistance polysilicon thin film 411 is led out.

High resistance polysilicon thin film 431 configuring a resistive field plate structure is also provided on high breakdown voltage n-type channel MOSFET 430. High resistance polysilicon thin film 431 provided on high breakdown voltage n-type channel MOSFET 430 also has a spiral planar form, in the same way as high resistance polysilicon thin film 411 provided on the high breakdown voltage junction termination region. One end portion of high resistance polysilicon thin film 431 on high breakdown voltage n-type channel MOSFET 430 is connected, for example, via contact portion 434 to ground electrode 435.

Ground electrode 435 of high breakdown voltage n-type channel MOSFET 430 is provided so as to enclose high resistance polysilicon thin film 431 on high breakdown voltage n-type channel MOSFET 430. The region in which ground electrode 435 of high breakdown voltage n-type channel MOSFET 430 is provided is also a ground region. Ground electrode 435 of high breakdown voltage n-type channel MOSFET 430 also has a ring-like planar form wherein one portion is opened, in the same way as ground electrode 161 of the high breakdown voltage junction termination region, and is not provided in portion 415 of the ground region crossed by drain wiring 432.

The other end portion of high resistance polysilicon thin film 431 of high breakdown voltage n-type channel MOSFET 430 is connected, for example, to the source region (not shown) of high breakdown voltage n-type channel MOSFET 430. Furthermore, the other end portion of high resistance polysilicon thin film 431 on high breakdown voltage n-type channel MOSFET 430 is led out via contact portion 436 to n-type well region 201 side in parallel with, for example, drain wiring 432, and connected to OUT electrode 160.

Next, a description will be given of a method of leading out the high potential side of high resistance polysilicon thin film 411 of the high breakdown voltage junction termination region in an interlayer dielectric. A description will be given of steps after the first interlayer dielectric is deposited on the LOCOS region. A plurality of portion 414 in which pickup contact portion 413 is not provided are formed in the first interlayer dielectric deposited on the LOCOS region. Next, high resistance polysilicon thin film 411 is deposited on the first interlayer dielectric, after which high resistance polysilicon thin film 411 is patterned.

When patterning high resistance polysilicon thin film 411, patterning is carried out so that high resistance polysilicon thin film 411 remains on first interlayer dielectric of portion 414 in which pickup contact portion 413 is not provided. Because of this, high breakdown voltage side high resistance polysilicon thin film 411 is led out onto first interlayer dielectric of portion 414 in which pickup contact portion 413 is not provided. The method of forming first contact portion 412 of high resistance polysilicon thin film 411 formed simultaneously at this time is the same as with the method of manufacturing the high voltage IC of Embodiment 2.

An oxide film layer that is to become the first interlayer dielectric is deposited on high resistance polysilicon thin film 411, and an aperture portion for connecting high resistance polysilicon thin film 411 and drain wiring 432 is formed in the first interlayer dielectric. At this time, an aperture portion for connecting high resistance polysilicon thin film 411 and OUT electrode 160 is also formed in the first interlayer dielectric. Next, the first metal layer is deposited on the first interlayer dielectric, thereby embedding the first metal layer in the aperture portion formed in the first interlayer dielectric.

Next, in the same way as with the method of manufacturing the high voltage IC according to Embodiment 1, the first metal layer is patterned, thereby forming drain wiring 432, OUT electrode 160, Vcc1 electrode 162, ground electrode 161, and the like. By so doing, drain wiring 432 and OUT electrode 160 are connected via high resistance polysilicon thin film 411.

The heretofore described method of leading out the high potential side of high resistance polysilicon thin film 411 of the high breakdown voltage junction termination region in an interlayer dielectric is such that high resistance polysilicon thin film 431 of high breakdown voltage n-type channel MOSFET 430 is formed together with high resistance polysilicon thin film 411 of the high breakdown voltage junction termination region. Also, ground electrode 435 of high breakdown voltage n-type channel MOSFET 430, and wiring that leads high resistance polysilicon thin film 431 out to n-type well region 201 side, are formed together with ground electrode 161, OUT electrode 160, Vcc1 electrode 162, and the like, of the high breakdown voltage junction termination region.

Also, a description has been given of a case wherein drain wiring 432 is formed of the first metal layer but, this not being limiting, drain wiring 432 may be formed of the second metal layer, or may be formed of a third metal layer deposited across an interlayer dielectric on the second metal layer.

Next, a description will be given of a modification example of the high voltage IC according to Embodiment 4. Drain wiring 432 of high breakdown voltage n-type channel MOSFET 430 and high-side drive circuit 300 may be connected using bonding wire, without drain wiring 432 of high breakdown voltage n-type channel MOSFET 430 being led out to the high breakdown voltage junction termination region. When wire bonding drain wiring 432 and high-side drive circuit 300, there is no need, for example, to provide portion 415 of the ground region crossed by drain wiring 432. Also, when forming drain wiring 432 and high-side drive circuit 300 with bonding wire, high resistance polysilicon thin film 431 of high breakdown voltage n-type channel MOSFET 430 is also connected to OUT electrode 160 of the high breakdown voltage junction termination region using bonding wire.

When connecting high resistance polysilicon thin film 431 and OUT electrode 160 using bonding wire, an OUT electrode bonding pad (not shown) for wire bonding high resistance polysilicon thin film 431 and OUT electrode 160 is provided, separately from a drain connection bonding pad (not shown) for wire bonding drain wiring 432 and high-side drive circuit 300, in the vicinity of the drain connection bonding pad. Further, the other end portion of high resistance polysilicon thin film 431 (the end portion on the side opposite to the end portion connected to the ground electrode 435) is connected to the OUT electrode bonding pad, and thus connected via bonding wire to the output terminal connection OUT pad (high potential region OUT pad) of high-side drive circuit 300.

Configurations of the high voltage IC according to Embodiment 4 other than the configuration of high breakdown voltage n-type channel MOSFET 430 and the configuration for connecting high breakdown voltage n-type channel MOSFET 430 to high-side drive circuit 300 and high breakdown voltage junction termination region are the same as those of the high voltage IC according to Embodiment 2. Steps in the method of manufacturing the high voltage IC according to Embodiment 4 other than the step of connecting high breakdown voltage n-type channel MOSFET 430 to high resistance polysilicon thin film 411 of the high breakdown voltage junction termination region are the same as with the method of manufacturing the high voltage IC according to Embodiment 2.

As heretofore described, according to the high voltage IC according to Embodiment 4, it is possible to obtain the same advantages as with the high voltage IC according to Embodiment 2. Also, according to the high voltage IC according to Embodiment 4, there is no adverse effect on the breakdown voltage characteristics of the high voltage IC even when high resistance polysilicon thin film 431 and OUT electrode 160 of the high breakdown voltage junction termination region are connected to high breakdown voltage n-type channel MOSFET 430. Because of this, it is possible to improve the breakdown voltage characteristics of the high breakdown voltage junction termination region, and also to improve the breakdown voltage characteristics of high breakdown voltage n-type channel MOSFET 430, and thus possible to further increase the reliability of the high voltage IC.

Embodiment 5

Figure 10:
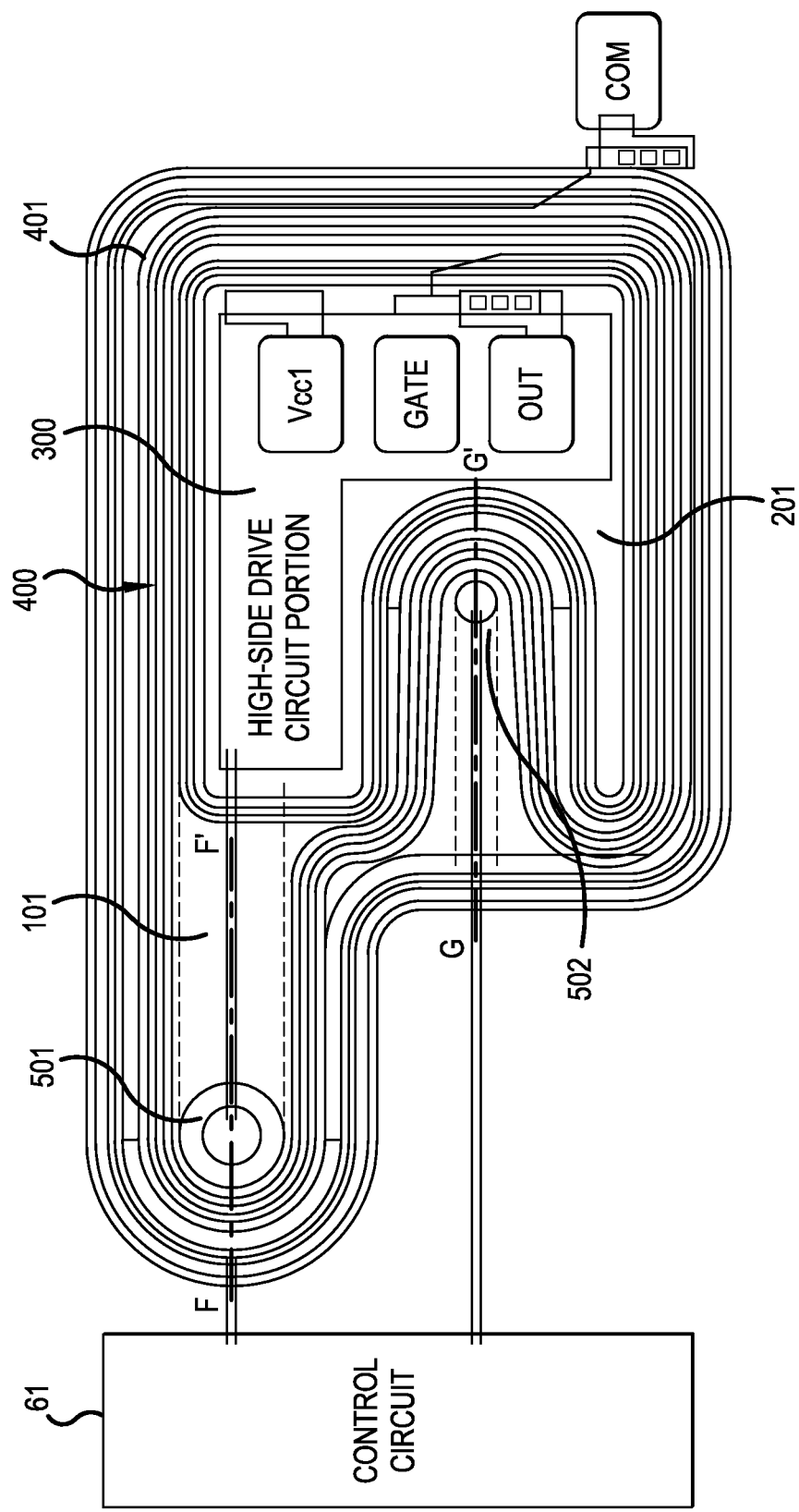
FIG. 10 is a plan view showing a main portion of a high voltage IC according to Embodiment 5.

FIG. 10 is a plan view showing a main portion of a high voltage IC according to Embodiment 5. FIG. 10 shows high-side drive circuit 300, high breakdown voltage junction termination region 400, and main portions of a high breakdown voltage transistor in the high voltage IC according to Embodiment 5. The high voltage IC according to Embodiment 5 differs from the high voltage IC according to Embodiment 1 in that a high breakdown voltage n-type channel MOSFET 501 and high breakdown voltage p-type channel MOSFET 502 are formed integrally with high breakdown voltage junction termination region (HVJT) 400.

As shown in FIG. 10, high breakdown voltage junction termination region 400, high breakdown voltage n-type channel MOSFET 501, and high breakdown voltage p-type channel MOSFET 502 are disposed on the same semiconductor substrate. High breakdown voltage junction termination region 400 has the same configuration as that of the high breakdown voltage junction termination region according to Embodiment 1. One each of high breakdown voltage n-type channel MOSFET 501 and high breakdown voltage p-type channel MOSFET 502 are shown in FIG. 10 but, this not being limiting, a plurality of each may be formed, or one of either high breakdown voltage n-type channel MOSFET 501 or high breakdown voltage p-type channel MOSFET 502 may be formed. The two-input type high breakdown voltage MOSFETs 1 and 2 configuring a level shift circuit are configured by disposing two of high breakdown voltage n-type channel MOSFET 501 (refer to FIG. 16).

High breakdown voltage n-type channel MOSFET 501 is disposed on n⁻ type region 101. Also, high breakdown voltage n-type channel MOSFET 501 is disposed in a position farther from n-type well region 201 than high breakdown voltage p-type channel MOSFET 502. High breakdown voltage n-type channel MOSFET 501 is connected to high-side drive circuit 300 and control circuit 61. High breakdown voltage p-type channel MOSFET 502 is in contact with n-type well region 201 on which high-side drive circuit 300 is provided. High breakdown voltage p-type channel MOSFET 502 is connected to control circuit 61.

High resistance polysilicon thin film 401 configuring the resistive field plate structure is disposed continuously with not only high breakdown voltage junction termination region 400, but also high breakdown voltage n-type channel MOSFET 501 and high breakdown voltage p-type channel MOSFET 502. For example, high resistance polysilicon thin film 401 is disposed in a spiral planar form so as to enclose the periphery of n-type well region 201 (high potential region) on which high-side drive circuit 300 and the like are provided, high breakdown voltage n-type channel MOSFET 501, and high breakdown voltage p-type channel MOSFET 502 excluding a portion wherein wiring for connection to control circuit 61 is led out.

Figure 11:
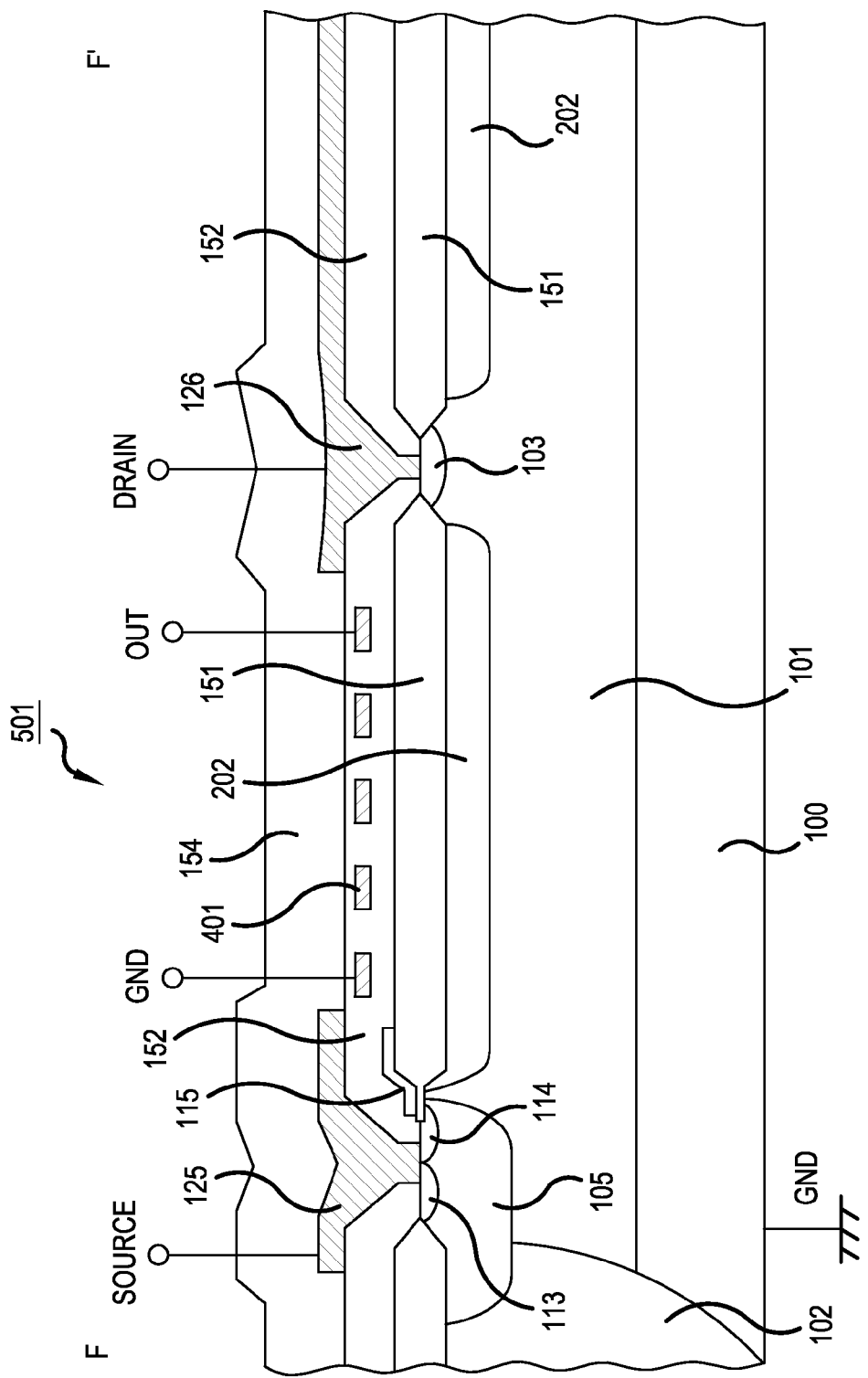
FIG. 11 is a sectional view showing a sectional structure along a cutting plane line F-F' in FIG. 10.

Next, a description will be given of a sectional structure of high breakdown voltage n-type channel MOSFET 501. FIG. 11 is a sectional view showing a sectional structure along a cutting plane line F-F' in FIG. 10. As shown in FIG. 11, n⁻ type region 101 and p-type well region 102 are provided in a surface layer of p⁻ type silicon substrate 100, in the same way as high breakdown voltage junction termination region 400. N⁻ type region 101 is a drift region of high breakdown voltage n-type channel MOSFET 501. P-type base region 105 is provided in a surface layer of n⁻ type region 101. P-type base region 105 is provided along p-type well region 102, and is in contact with p-type well region 102.

A p-type region formed of p-type well region 102 and p-type base region 105 is a base region of high breakdown voltage n-type channel MOSFET 501. The pickup p⁺ type region 113 and an n⁺⁺ type source region (a second conductivity type region) 114 are selectively provided in a surface layer of p-type base region 105. The pickup p⁺ type region 113 is provided nearer to p-type well region 102 than n⁺⁺ type source region 114, and is in contact with n⁺⁺ type source region 114. Also, pickup p⁺ type region 113 has an impurity concentration higher than that of p-type base region 105. N⁺⁺ type source region 114 has an impurity concentration higher than that of n⁻ type region 101.

Also, pickup n⁺ type region 103 is selectively provided, distanced from p-type base region 105, in a surface layer of n⁻ type region 101. Furthermore, p-type offset region 202 is provided, distanced from p-type base region 105 and pickup n⁺ type region 103, in a surface layer of n⁻ type region 101. The diffusion depth Xj of p-type offset region 202 is smaller than the diffusion depth Xj of n⁻ type region 101. N⁻ type region 101, p-type offset region 202, and p-type well region 102 are covered by LOCOS region 151, in the same way as high breakdown voltage junction termination region 400.

Pickup n⁺ type region 103, pickup p⁺ type region 113, and n⁺⁺ type source region 114 are not covered by LOCOS region 151. Gate electrode 115 is provided across a gate oxide film on the surface of p-type base region 105 sandwiched by n⁺⁺ type source region 114 and n⁻ type region 101. Gate electrode 115 extends to LOCOS region 151. First interlayer dielectric 152 is deposited on LOCOS region 151, in the same way as high breakdown voltage junction termination region 400.

Source electrode 125 is in contact with pickup p⁺ type region 113 and n⁺⁺ type source region 114 through an aperture portion provided in first interlayer dielectric 152. Source electrode 125 is formed of a first layer first metal layer. Also, source electrode 125 is isolated from the gate electrode 115 by first interlayer dielectric 152. Drain electrode 126 is in contact with pickup n⁺ type region 103 through an aperture portion provided in first interlayer dielectric 152. Source electrode 125 and drain electrode 126 are formed of the first layer first metal layer.

High resistance polysilicon thin film 401 is provided, in the same way as high breakdown voltage junction termination region 400, in first interlayer dielectric 152 deposited on LOCOS region 151 covering n⁻ type region 101 between pickup n⁺ type region 103 and p-type base region 105. High resistance polysilicon thin film 401 of high breakdown voltage n-type channel MOSFET 501 is such that the end portion on drain electrode 126 side is connected to the OUT pad, while the end portion on source electrode 125 side is connected to the ground pad. Source electrode 125, drain electrode 126, and first interlayer dielectric 152 are covered by passivation film 154.

Figure 12:
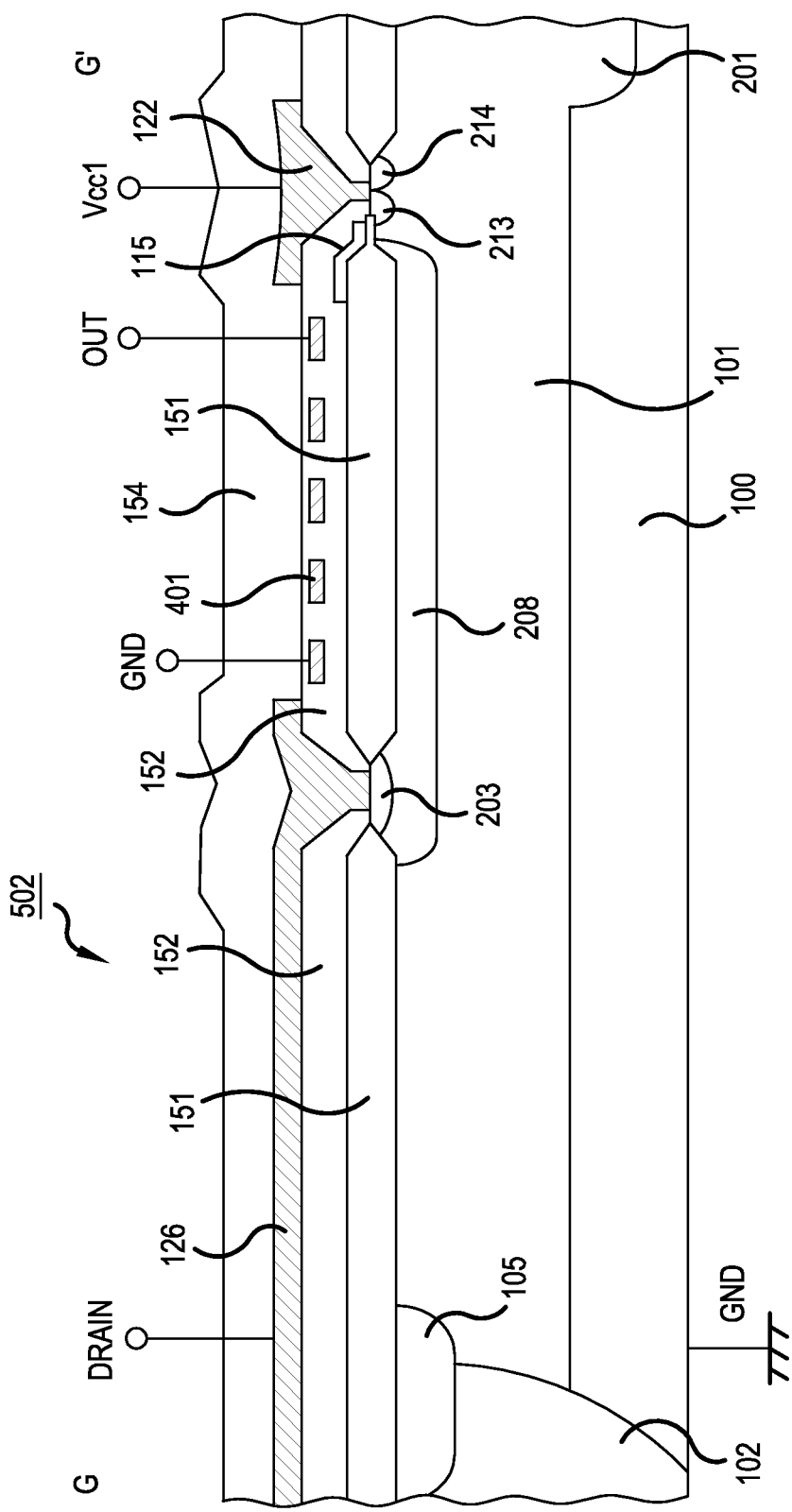
FIG. 12 is a sectional view showing a sectional structure along a cutting plane line G-G' in FIG. 10.

Next, a description will be given of a sectional structure of high breakdown voltage p-type channel MOSFET 502. FIG. 12 is a sectional view showing a sectional structure along a cutting plane line G-G' in FIG. 10. As shown in FIG. 12, n-type well region 201, n⁻ type region 101, and p-type well region 102 are provided in a surface layer of p⁻ type silicon substrate 100, in the same way as high breakdown voltage junction termination region 400. N⁻ type region 101 is a base region of high breakdown voltage p-type channel MOSFET 502. P-type body region 208 is provided, distanced from p-type well region 102, in a surface layer of n⁻ type region 101. P-type body region 208 is a drift region of high breakdown voltage p-type channel MOSFET 502.

P⁺⁺ type source region (a first conductivity type region) 213 and pickup n⁺ type region 214 are selectively provided in a surface layer of n⁻ type region 101. P⁺⁺ type source region 213 is provided nearer to p-type well region 102 than pickup n⁺ type region 214, and is in contact with pickup n⁺ type region 214. Also, p⁺⁺ type source region 213 is distanced from p-type body region 208 provided nearer to p-type well region 102 than the p⁺⁺ type source region 213. The p⁺⁺ type source region 213 has an impurity concentration higher than that of p-type body region 208.

Pickup p⁺ type region 203 is provided in a surface layer of p-type body region 208. Pickup p⁺ type region 203 is provided on p-type well region 102 side in p-type body region 208. Also, pickup p⁺ type region 203 has an impurity concentration higher than that of p-type body region 208. The diffusion depth Xj of p-type body region 208 is smaller than the diffusion depth Xj of n⁻ type region 101. P-type base region 105 is provided in a surface layer of n⁻ type region 101. P-type base region 105 is provided along p-type well region 102, and is in contact with p-type well region 102. N⁻ type region 101, one portion of p-type body region 208, and p-type well region 102 are covered by LOCOS region 151, in the same way as high breakdown voltage junction termination region 400.

Pickup n⁺ type region 203, p⁺⁺ type source region 213, and pickup n⁺ type region 214 are not covered by LOCOS region 151. Gate electrode 115 is provided across a gate oxide film on the surface of n⁻ type region 101 sandwiched by p⁺⁺ type source region 213 and p-type body region 208. Gate electrode 115 extends to LOCOS region 151. First interlayer dielectric 152 is deposited on LOCOS region 151, in the same way as high breakdown voltage junction termination region 400.

Vcc1 electrode 122 is in contact with p⁺⁺ type source region 213 and pickup n⁺ type region 214 through an aperture portion provided in first interlayer dielectric 152. Vcc1 electrode 122 is an electrode the same as the Vcc1 electrode provided in high breakdown voltage junction termination region 400. Drain electrode 126 is in contact with the pickup n⁺ type region 203 through an aperture portion provided in first interlayer dielectric 152. Drain electrode 126 is an electrode the same as the drain electrode provided in high breakdown voltage n-type channel MOSFET 501.

High resistance polysilicon thin film 401 is provided, in the same way as high breakdown voltage junction termination region 400, in first interlayer dielectric 152 deposited on LOCOS region 151 covering p-type body region 208 between pickup n⁺ type region 203 and p⁺⁺ type source region 213. High resistance polysilicon thin film 401 of high breakdown voltage p-type channel MOSFET 502 is such that the end portion on Vcc1 electrode 122 side is connected to the OUT pad, while the end portion on drain electrode 126 side is connected to the ground pad. Vcc1 electrode 122, drain electrode 126, and first interlayer dielectric 152 are covered by passivation film 154.

Configurations of the high voltage IC according to Embodiment 5 other than the configurations of high breakdown voltage n-type channel MOSFET 501 and high breakdown voltage p-type channel MOSFET 502, and the disposition of high resistance polysilicon thin film 401, are the same as those of the high voltage IC according to Embodiment 1. The method of manufacturing high breakdown voltage junction termination region 400 of the high voltage IC according to Embodiment 5 is the same as that of the high breakdown voltage junction termination region of the high voltage IC according to Embodiment 1. The n-type region, p-type region, and each electrode formed of the first and second metal layers of high breakdown voltage n-type channel MOSFET 501 and high breakdown voltage p-type channel MOSFET 502 are formed together with the n-type region, p-type region, and each electrode formed of the first and second metal layers of high breakdown voltage junction termination region 400.

As heretofore described, according to the high voltage IC according to Embodiment 5, it is possible to obtain the same advantages as with the high voltage IC according to Embodiment 1. By providing high resistance polysilicon thin film 401 continuous with high breakdown voltage junction termination region 400, high breakdown voltage n-type channel MOSFET 501, and high breakdown voltage p-type channel MOSFET 502, it is possible to maintain an even electric field distribution in the region between OUT electrode 120 and ground electrode 121. Because of this, it is possible to realize increased reliability of high breakdown voltage junction termination region 400, high breakdown voltage n-type channel MOSFET 501, and high breakdown voltage p-type channel MOSFET 502.

Embodiment 6

Figure 13:
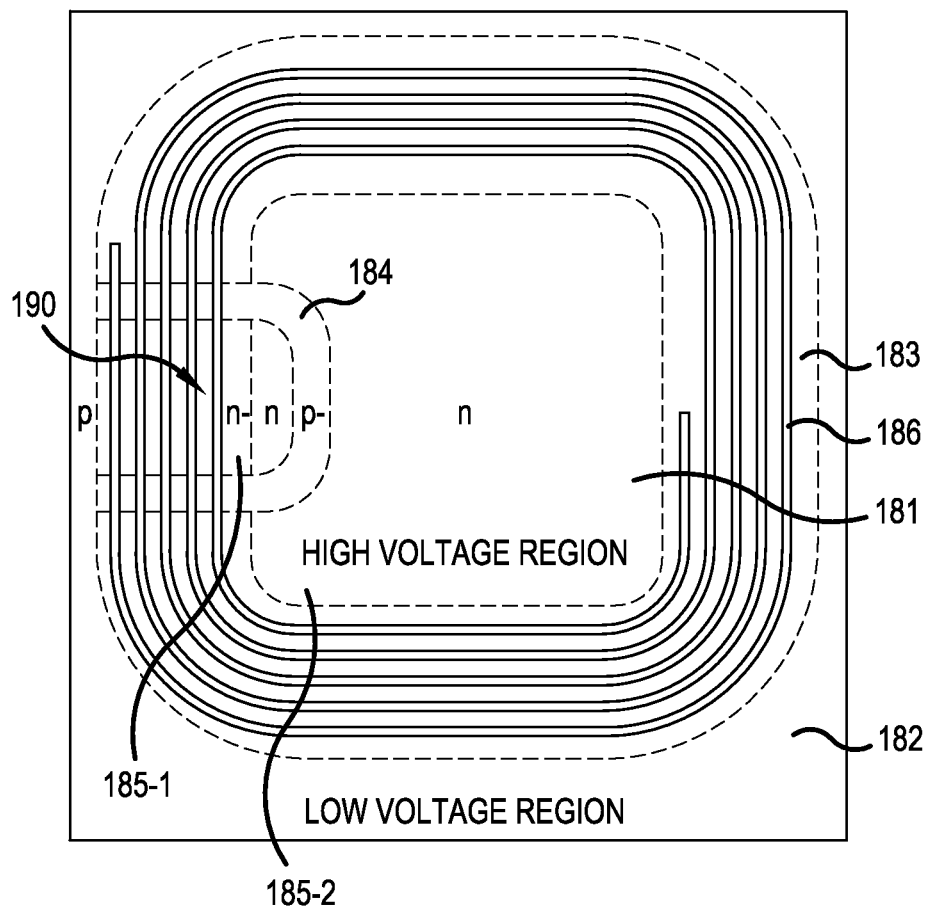
FIG. 13 is a plan view showing a main portion of a high voltage IC according to Embodiment 6.
Figure 14:
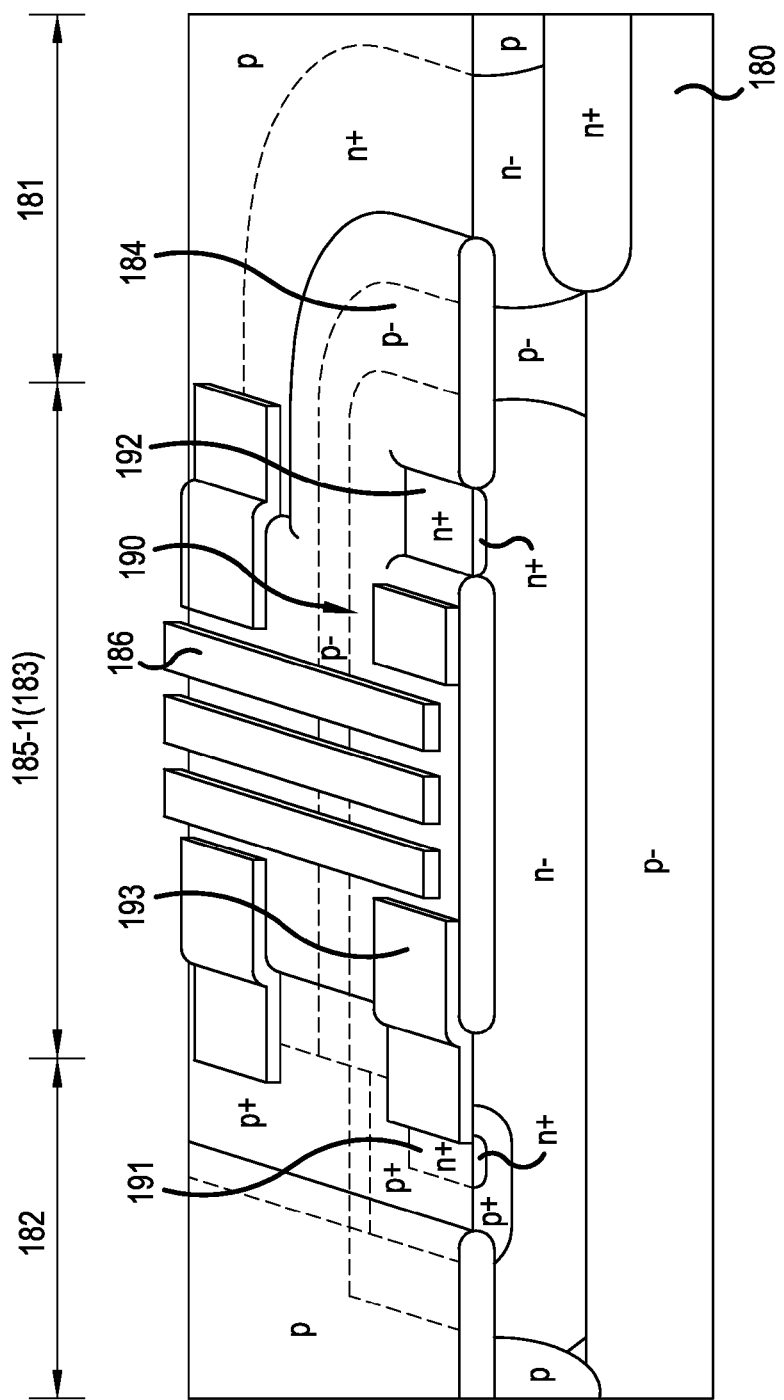
FIG. 14 is a perspective view schematically showing a main portion of one region of the high voltage IC according to Embodiment 6.

FIG. 13 is a plan view showing a main portion of a high voltage IC according to Embodiment 6. Also, FIG. 14 is a perspective view schematically showing main portions of one region of the high voltage IC according to Embodiment 6. FIG. 13 shows main portions of a high potential region 181, low potential region 182, high breakdown voltage junction termination region 183, and high breakdown voltage MOSFET 190. FIG. 14 shows the configuration of high breakdown voltage MOSFET 190. The high voltage IC according to Embodiment 6 differs from Embodiment 1 in that high breakdown voltage MOSFET 190 is provided in high breakdown voltage junction termination region 183.

As shown in FIGS. 13 and 14, high potential region 181 is an n-type region, with a higher potential than other regions, in which, for example, a high-side drive circuit and the like are provided. High potential region 181 corresponds to, for example, the n-type well region of Embodiment 1. Low potential region 182 is a p-type region with a potential lower than that of high potential region 181, and corresponds to the p-type well region of Embodiment 1, and to a region with a concentration lower than that of a high potential region partitioned off by the p-type well region. Low potential region 182 encloses high breakdown voltage junction termination region 183.

High breakdown voltage junction termination region 183 is provided between high potential region 181 and low potential region 182 so as to enclose high potential region 181. High breakdown voltage junction termination region 183 is a region with an impurity concentration lower than that of high potential region 181, and corresponds to the n⁻ type region of Embodiment 1. P⁻ type region 184 (a first conductivity type separation region) encloses one portion (hereafter referred to as a first region) 185-1 of high breakdown voltage junction termination region 183 so as to include one portion of high potential region 181.

Specifically, for example, the planar form of p⁻ type region 184 defines a practically rectangular outline having one portion of the interface between low potential region 182 and high breakdown voltage junction termination region 183 as one side. Further, p⁻ type region 184 encloses one portion of high breakdown voltage junction termination region 183 so as to cross high breakdown voltage junction termination region 183 from the interface between low potential region 182 and high breakdown voltage junction termination region 183 to high potential region 181. Also, p⁻ type region 184 penetrates the n⁻ type region, which is high breakdown voltage junction termination region 183, in the depth direction of p⁻ type silicon substrate 180, reaching p⁻ type silicon substrate 180.

An n-type region formed of high potential region 181 and high breakdown voltage junction termination region 183 is divided by p⁻ type region 184 into first region 185-1 enclosed by p⁻ type region 184 and a region (hereafter referred to as a second region) 185-2 excluding first region 185-1. The range of the n-type region formed of high potential region 181 and high breakdown voltage junction termination region 183 forming first region 185-1 is narrower than the range forming second region 185-2. For example, second region 185-2 encloses a portion of first region 185-1 other than the portion in contact with low potential region 182 across p⁻ type region 184.

High breakdown voltage MOSFET 190, formed of source region 191, drain region 192, gate region 193, and the like, is provided in first region 185-1 enclosed by p⁻ type region 184. That is, high breakdown voltage MOSFET 190 is formed integrally with high breakdown voltage junction termination region 183, in the same way as, for example, the high breakdown voltage n-type channel MOSFET or high breakdown voltage p-type channel MOSFET according to Embodiment 5.

High resistance polysilicon thin film 186 configuring a resistive field plate structure is disposed in a spiral form on high breakdown voltage junction termination region 183, in the same way as in Embodiment 1. High resistance polysilicon thin film 186 is such that one end portion is connected to the ground electrode (not shown), while the other end portion is connected to the OUT electrode (not shown), in the same way as in the high voltage IC according to Embodiment 1. Configurations of the high voltage IC according to Embodiment 6 other than p⁻ type region 184 and high breakdown voltage MOSFET 190 are the same as those of the high voltage IC according to Embodiment 1.

As heretofore described, according to the high voltage IC according to Embodiment 6, it is possible to obtain the same advantages as with the high voltage IC according to Embodiment 1.

Heretofore, the invention has been described using a silicon (Si) substrate as a semiconductor substrate but, the heretofore described embodiments not being limiting, a semiconductor substrate other than silicon, such as silicon carbide (SiC) or gallium nitride (GaN), may be used. Also, a description has been given of a wiring process wherein each electrode, such as the OUT electrode, ground electrode, and Vcc1 electrode, is formed in a two-layer configuration of the first and second metal layers, but the wiring process may be carried out using three or more metal layers. Also, the high resistance polysilicon thin films may be configured of two or more layers.

As heretofore described, the semiconductor device according to the invention is useful as a semiconductor device including a resistive field plate structure, and is particularly useful as a high breakdown voltage semiconductor device that drives an upper arm or lower arm power device of a power inversion bridge circuit configuration using a bootstrap circuit.

Thus, a semiconductor device and method for its manufacture have been described according to the present invention. Many modifications and variations may be made to the techniques and structures described and illustrated herein without departing from the spirit and scope of the invention. Accordingly, it should be understood that the devices and methods described herein are illustrative only and are not limiting upon the scope of the invention.

What is claimed is:

1. A semiconductor device, comprising:
   a second conductivity type well region, one surface of which is in contact with a first conductivity type semiconductor layer;
   a first conductivity type well region in contact with the second conductivity type well region and enclosing the second conductivity type well region;
   a second conductivity type high concentration region provided in the second conductivity type well region and having an impurity concentration higher than that of the second conductivity type well region;
   a first conductivity type high concentration region provided in the first conductivity type well region and having an impurity concentration higher than that of the first conductivity type well region;
   an insulation film provided on the other surface of the second conductivity type well region;
   a resistive thin film provided on the insulation film;
   a circuit disposed at the inside of the second conductivity type well region;
   a first electrode connected to the first conductivity type high concentration region;
   a second electrode, connected to a high potential side wiring of the power supply of the circuit and to the second conductivity type high concentration region, to which is applied a voltage higher than the voltage applied to the first electrode; and
   a third electrode, disposed in an inner peripheral side of the first electrode than the resistive thin film layer, and connected to a low potential side wiring of the power supply, and not connected to a high potential side wiring of the power supply,
   wherein a first end portion of the resistive thin film layer is connected to the first electrode, while a second end portion of the resistive thin film layer is connected to the third electrode.

2. A semiconductor device, comprising:
   a second conductivity type well region one surface of which is in contact with a first conductivity type semiconductor layer;
   a first conductivity type well region in contact with the second conductivity type well region and enclosing the second conductivity type well region;
   a second conductivity type high concentration region provided in the second conductivity type well region and having an impurity concentration higher than that of the second conductivity type well region;
   a first conductivity type high concentration region provided in the first conductivity type well region and having an impurity concentration higher than that of the first conductivity type well region;

a first conductivity type body region provided more shallowly than the second conductivity type well region on the other surface side of the second conductivity type well region in the second conductivity type well region;

an insulation film that covers the other surface of the first conductivity type body region;

a resistive thin film provided on the insulation film;

a circuit disposed at the inside of the second conductivity type well region;

a first electrode connected to the first conductivity type high concentration region;

a second electrode, connected to a high potential side wiring of the power supply of the circuit and to the second conductivity type high concentration region, to which is applied a voltage higher than the voltage applied to the first electrode; and a third electrode, disposed in an inner peripheral side of the first electrode than the resistive thin film layer, and connected to a low potential side wiring of the power supply, and not connected to a high potential side wiring of the power supply, wherein one end portion of the resistive thin film layer is connected to the first electrode, while the other end portion of the resistive thin film layer is connected to the third electrode.

3. The semiconductor device according to claim 1, wherein the second electrode is connected to the positive electrode side of a bootstrap capacitor configuring a bootstrap circuit, and the third electrode is connected to the negative electrode side of the bootstrap capacitor.

4. The semiconductor device according to claim 1, further comprising a diode structure configured with the second conductivity type well region as a cathode region and the first conductivity type well region as an anode region.

5. The semiconductor device according to claim 1, further comprising a transistor structure configured with the second conductivity type well region as a drift region, the first conductivity type well region as a base region, and a second conductivity type region provided in the first conductivity type well region and connected to the first electrode as a source region.

6. The semiconductor device according to claim 2, further comprising a transistor structure configured with the first conductivity type body region as a drift region, the second conductivity type well region as a base region, and a first conductivity type region provided in the second conductivity type well region and connected to the second electrode as a source region.

7. The semiconductor device according to claim 1, wherein the resistive thin film layer is disposed in a spiral form.

8. The semiconductor device according to claim 1, wherein the second end portion of the resistive thin film layer is led out in the dielectric between the second conductivity type well region and the second electrode, and connected to the third electrode.

9. The semiconductor device according to claim 1, further comprising a first conductivity type separation region enclosing one portion of the second conductivity type well region, wherein an insulated gate field effect transistor with the second conductivity type well region as a drift region is provided in a region of the second conductivity type well region enclosed by the first conductivity type separation region.

10. The semiconductor device according to claim 1, wherein the resistive thin film layer is made of polysilicon.

11. The semiconductor device according to claim 1, wherein the second conductivity type well region is a diffusion layer.

12. The semiconductor device according to claim 1, wherein the second conductivity type well region is an epitaxial layer.

13. A semiconductor device, comprising:

a second conductivity type well region one surface of which is in contact with a first conductivity type semiconductor layer;

a first conductivity type well region in contact with the second conductivity type well region and enclosing the second conductivity type well region;

a second conductivity type high concentration region provided in the second conductivity type well region and having an impurity concentration higher than that of the second conductivity type well region;

a first conductivity type high concentration region provided in the first conductivity type well region and having an impurity concentration higher than that of the first conductivity type well region;

a first conductivity type body region provided more shallowly than the second conductivity type well region on the other surface side of the second conductivity type well region in the second conductivity type well region;

an insulation film that covers the other surface of the first conductivity type body region;

a resistive thin film provided on the insulation film;

a first electrode connected to the first conductivity type high concentration region;

a second electrode, connected to the second conductivity type high concentration region, to which is applied a voltage higher than the voltage applied to the first electrode; and a third electrode, disposed in an inner peripheral side of the first electrode than the resistive thin film layer, to which is applied a voltage higher than the voltage applied to the first electrode and lower than the voltage applied to the second electrode, which third electrode is not connected to a high potential side wiring of the power supply, wherein one end portion of the resistive thin film layer is connected to the first electrode, while the other end portion of the resistive thin film layer is connected to the third electrode and wherein the second electrode and the third electrode are electrically separated from each other.

14. The semiconductor device according to claim 1, wherein the circuit is a driving circuit which drives a switching element.

15. The semiconductor device according to claim 14, further comprising a terminal for connecting to a low potential side terminal of the switching element, wherein the low potential side wiring of the power supply of the driving circuit is connected to the terminal.

* * * * *